(12) United States Patent
Miyanaga et al.

(10) Patent No.: US 11,024,744 B2
(45) Date of Patent: Jun. 1, 2021

(54) SEMICONDUCTOR DEVICE AND METHOD FOR MANUFACTURING THE SAME

(71) Applicant: Sumitomo Electric Industries, Ltd., Osaka (JP)

(72) Inventors: Miki Miyanaga, Itami (JP); Kenichi Watatani, Itami (JP); Hideaki Awata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/468,735

(22) PCT Filed: Jul. 11, 2017

(86) PCT No.: PCT/JP2017/025245
§ 371 (c)(1),
(2) Date: Jun. 12, 2019

(87) PCT Pub. No.: WO2018/109970
PCT Pub. Date: Jun. 21, 2018

(65) Prior Publication Data
US 2019/0319132 A1    Oct. 17, 2019

(30) Foreign Application Priority Data
Dec. 12, 2016    (JP) .............................. JP2016-240229

(51) Int. Cl.
*H01L 29/786*    (2006.01)
*H01L 21/02*    (2006.01)
(Continued)

(52) U.S. Cl.
CPC .... *H01L 29/7869* (2013.01); *H01L 21/02345* (2013.01); *H01L 21/02565* (2013.01);
(Continued)

(58) Field of Classification Search
CPC ........... H01L 29/7869; H01L 21/02565; H01L 29/78693
See application file for complete search history.

(56) References Cited

U.S. PATENT DOCUMENTS

2005/0239660 A1    10/2005    Abe et al.
2012/0001167 A1    1/2012    Morosawa
(Continued)

FOREIGN PATENT DOCUMENTS

JP    2009-272427 A    11/2009
JP    2010-219538 A    9/2010
(Continued)

*Primary Examiner* — Jay C Chang
*Assistant Examiner* — Mikka Liu
(74) *Attorney, Agent, or Firm* — Baker Botts L.L.P.; Michael A. Sartori

(57) ABSTRACT

Provided is a semiconductor device including: a gate electrode; a channel layer arranged in a region directly below or directly above the gate electrode; a source and a drain electrodes arranged to be in contact with the channel layer; and a first insulating layer arranged between the gate electrode and the channel layer, the channel layer including a first oxide semiconductor, the source electrode and/or the drain electrode including a second oxide semiconductor, the first and second oxide semiconductors containing In, W and Zn, a content rate of W/(In+W+Zn) being higher than 0.001 atomic % and not higher than 8.0 atomic %, a content rate of Zn/(In+W+Zn) being from 1.2 atomic % to 40 atomic %, an atomic ratio of Zn to W being higher than 1.0 and lower than 20000. Also provided is a method for manufacturing the device.

20 Claims, 3 Drawing Sheets

(51) Int. Cl.
  *H01L 29/24* (2006.01)
  *H01L 29/45* (2006.01)
  *H01L 29/66* (2006.01)

(52) U.S. Cl.
  CPC ........ *H01L 21/02631* (2013.01); *H01L 29/24* (2013.01); *H01L 29/45* (2013.01); *H01L 29/66969* (2013.01); *H01L 29/78693* (2013.01); *H01L 21/0214* (2013.01); *H01L 21/02164* (2013.01); *H01L 21/02178* (2013.01)

(56) References Cited

U.S. PATENT DOCUMENTS

| | | |
|---|---|---|
| 2012/0184066 A1 | 7/2012 | Yano et al. |
| 2015/0256157 A1* | 9/2015 | Kozuma ................ H03K 3/012 |
| 2016/0251264 A1 | 9/2016 | Miyanaga et al. |
| 2017/0012133 A1 | 1/2017 | Miyanaga et al. |
| 2017/0022602 A1* | 1/2017 | Miyanaga et al. ................ C23C 14/3414 |
| 2017/0069474 A1 | 3/2017 | Miyanaga et al. |

FOREIGN PATENT DOCUMENTS

| | | | | |
|---|---|---|---|---|
| JP | 2012-525000 A | | 10/2012 | |
| JP | 2015-056566 A | | 3/2015 | |
| JP | PCT/JP2015/058061 | * | 10/2015 | ......... C23C 14/3414 |
| KR | 10-2006-0046691 A | | 5/2006 | |
| KR | 10-2012-0003803 A | | 1/2012 | |
| NO | 2010-123633 A1 | | 10/2010 | |
| WO | 2011/040028 A1 | | 4/2011 | |
| WO | 2016/121152 A1 | | 8/2016 | |
| WO | 2016/129146 A1 | | 8/2016 | |

* cited by examiner

SEMICONDUCTOR DEVICE AND METHOD FOR MANUFACTURING THE SAME

TECHNICAL FIELD

The present invention relates to a semiconductor device including an oxide semiconductor layer containing indium (In), tungsten (W) and zinc (Zn), and a method for manufacturing the same. The present application claims the priority based on Japanese Patent Application No. 2016-240229 which is the Japanese patent application filed on Dec. 12, 2016. The entire contents described in this Japanese patent application are hereby incorporated by reference.

BACKGROUND ART

In a liquid crystal display device, a thin-film EL (electroluminescence) display device, an organic EL display device or the like, an amorphous silicon (a-Si) film has been conventionally mainly used as a semiconductor film that functions as a channel layer of a TFT (thin-film transistor) which is a semiconductor device.

In recent years, attention has been focused on a composite oxide including indium (In), gallium (Ga) and zinc (Zn), i.e., an In—Ga—Zn-based composite oxide (also referred to as "IGZO"), as an alternative material to a-Si. For example, Japanese Patent Laying-Open No. 2010-219538 (PTL 1) describes that an oxide semiconductor film mainly composed of IGZO is formed by a sputtering method in which an oxide sintered body is used as a target.

An IGZO-based oxide semiconductor can be expected to have a carrier mobility higher than that of a-Si. However, a field-effect mobility of the IGZO-based oxide semiconductor is generally 10 cm$^2$/Vs. Therefore, with increase in size and increase in resolution of recent display devices, a higher mobility has been sought.

CITATION LIST

Patent Literature

PTL 1: Japanese Patent Laying-Open No. 2010-219538
PTL 2: Japanese Patent Laying-Open No. 2015-056566

SUMMARY OF INVENTION

A semiconductor device according to one embodiment of the present invention includes: a gate electrode; a channel layer arranged in a region directly below or directly above the gate electrode; a source electrode and a drain electrode arranged to be in contact with the channel layer; and a first insulating layer arranged between the gate electrode and the channel layer. The channel layer includes a first oxide semiconductor, and at least one of the source electrode and the drain electrode includes a second oxide semiconductor. The first oxide semiconductor and the second oxide semiconductor contain indium, tungsten and zinc. A content rate of tungsten to a total of indium, tungsten and zinc in the first oxide semiconductor and the second oxide semiconductor is higher than 0.001 atomic % and not higher than 8.0 atomic %. A content rate of zinc to the total of indium, tungsten and zinc in the first oxide semiconductor and the second oxide semiconductor is not lower than 1.2 atomic % and not higher than 40 atomic %. An atomic ratio of zinc to tungsten in the first oxide semiconductor and the second oxide semiconductor is higher than 1.0 and lower than 20000. The first insulating layer can be a gate insulating layer.

A method for manufacturing a semiconductor device according to another embodiment of the present invention is a method for manufacturing the semiconductor device according to the above-described embodiment, including: forming the gate electrode; forming a layer including an oxide semiconductor; forming a partially covering insulating layer covering a part of a main surface of the layer including the oxide semiconductor; and performing heat treatment. The heat treatment is performed after forming the partially covering insulating layer.

DETAILED DESCRIPTION

Figure 1:
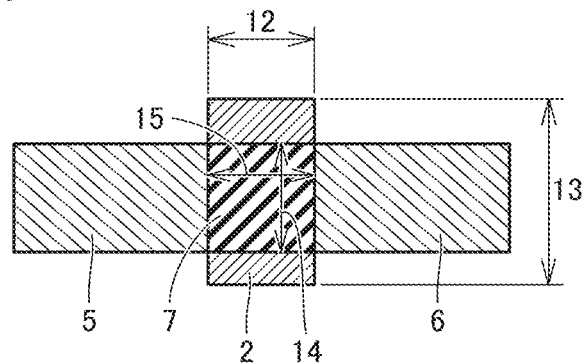
FIG. 1 is a schematic view of a semiconductor device when viewed from above.

Problem to be Solved by the Present Disclosure

In manufacturing of a TFT, it is common to use photolithography for exposing a resist to ultraviolet rays. In the exposure to ultraviolet rays, a glass plate called "photomask", which has a metal film in a region that requires blockage of the ultraviolet rays, is used in order to irradiate only the resist (photoresist) in a necessary region with light. However, such exposure to ultraviolet rays using the photomask leads to an increase in manufacturing cost of the TFT.

In the case of manufacturing a TFT by photolithography with a photomask, each of a source electrode and a drain electrode is designed and formed such that a part thereof is superimposed on a gate electrode with a gate insulating layer interposed therebetween, when the TFT is viewed from above. This is because when a width of the gate electrode is shorter than a distance between the source electrode and the drain electrode, a channel layer in a portion where the gate electrode is absent does not generate a carrier even if a voltage is applied to the gate electrode, and thus, the TFT does not operate. Such superimposing structure of the electrodes generates a parasitic capacitance between the gate electrode and the source electrode and between the gate electrode and the drain electrode, and thus, degrades the characteristics of the TFT.

PTL 2 describes a top gate-type TFT including an oxide semiconductor layer (TAOS layer 12) composed of IGZO. This TFT is fabricated using a self alignment technique for patterning a gate insulating film 14 using a gate electrode 15 as a photomask, to thereby expose a part of TAOS layer 12 directly below gate insulating film 14. The aforementioned part (region not covered with gate insulating film 14) of TAOS layer 12 is decreased in resistance by reduction treatment with a reducing gas (TAOS reduced layer 13), and is used as a connection electrode for connecting the source electrode and the drain electrode.

According to the TFT described in PTL 2, the parasitic capacitance caused by the superimposing structure of the electrodes can be decreased. However, the reduction treatment with the reducing gas is complicated in terms of operation, and further, the TFT has room for improvement in terms of increasing the field-effect mobility.

An object of the present invention is to provide a new semiconductor device that makes it possible to decrease a parasitic capacitance, has high field-effect mobility and preferably further has high reliability under light irradiation. Another object of the present invention is to provide a method for manufacturing a semiconductor device, by which the above-described semiconductor device can be manufactured relatively easily.

Advantageous Effect of the Present Disclosure

According to the foregoing, there can be provided a semiconductor device that makes it possible to decrease a parasitic capacitance, has high field-effect mobility and preferably further has high reliability under light irradiation. There can also be provided a method for manufacturing a semiconductor device, by which the above-described semiconductor device can be manufactured relatively easily.

Description of Embodiments of the Present Invention

First, embodiments of the present invention will be listed and described.

[1] A semiconductor device according to one embodiment of the present invention includes: a gate electrode; a channel layer arranged in a region directly below or directly above the gate electrode; a source electrode and a drain electrode arranged to be in contact with the channel layer; and a first insulating layer arranged between the gate electrode and the channel layer, the channel layer includes a first oxide semiconductor, at least one of the source electrode and the drain electrode includes a second oxide semiconductor, and the first oxide semiconductor and the second oxide semiconductor contain indium (In), tungsten (W) and zinc (Zn). A content rate of W (hereinafter also referred to as "W content rate") to a total of In, W and Zn in the first oxide semiconductor and the second oxide semiconductor is higher than 0.001 atomic % and not higher than 8.0 atomic %. A content rate of Zn (hereinafter also referred to as "Zn content rate") to the total of In, W and Zn in the first oxide semiconductor and the second oxide semiconductor is not lower than 1.2 atomic % and not higher than 40 atomic %. An atomic ratio of Zn to W (hereinafter also referred to as "Zn/W ratio") in the first oxide semiconductor and the second oxide semiconductor is higher than 1.0 and lower than 20000. The first insulating layer can be a gate insulating layer.

The semiconductor device of the present embodiment can decrease the parasitic capacitance, and can show high field-effect mobility. Furthermore, the semiconductor device of the present embodiment is also advantageous in terms of increasing the reliability under light irradiation. The semiconductor device is specifically a TFT (thin-film transistor).

[2] Preferably, in the semiconductor device of the present embodiment, content rates of In, W and Zn in the first oxide semiconductor are the same as content rates of In, W and Zn in the second oxide semiconductor, respectively. As a result, particularly when the channel layer, the source electrode and the drain electrode are separately formed by self alignment using the gate electrode, the manufacturing process of the semiconductor device can be simplified.

[3] Preferably, in the semiconductor device of the present embodiment, an electric resistivity of the channel layer is not lower than $10^{-1}$ $\Omega$cm, and an electric resistivity of the source electrode and the drain electrode is not higher than $10^{-2}$ $\Omega$cm. This is advantageous in terms of increasing the field-effect mobility of the semiconductor device.

[4] In the semiconductor device of the present embodiment, the first oxide semiconductor and the second oxide semiconductor can be composed of nanocrystalline oxide or amorphous oxide. This is advantageous in terms of increasing the field-effect mobility of the semiconductor device, and is also advantageous in terms of increasing the reliability under light irradiation of the semiconductor device.

[5] In the semiconductor device of the present embodiment, the first insulating layer can be a layer covering a main surface of the channel layer and not covering main surfaces of the source electrode and the drain electrode. One example of this semiconductor device is a top gate-type TFT. The feature that the first insulating layer is a layer covering the main surface of the channel layer and not covering the main surfaces of the source electrode and the drain electrode is advantageous in terms of decreasing the parasitic capacitance of the semiconductor device and increasing the field-effect mobility and the reliability under light irradiation of the semiconductor device. When the first insulating layer is a layer covering the main surface of the channel layer and not covering the main surfaces of the source electrode and the drain electrode, at least one embodiment of the semiconductor device does not necessarily need to have an insulating layer covering the main surfaces of the source electrode and the drain electrode.

[6] In the semiconductor device of the present embodiment, when the first insulating layer is a layer covering the main surface of the channel layer and not covering the main surfaces of the source electrode and the drain electrode, another embodiment of the semiconductor device can further include a low oxygen insulating layer that is an insulating layer covering the main surfaces of the source electrode and the drain electrode and is lower in oxygen atom content rate than the first insulating layer. This is also advantageous in terms of increasing the field-effect mobility and the reliability under light irradiation of the semiconductor device.

[7] In addition to the first insulating layer, the semiconductor device of the present embodiment may further include a second insulating layer covering a main surface of the channel layer and not covering main surfaces of the source electrode and the drain electrode. One example of this semiconductor device is a bottom gate-type TFT. Further inclusion of the second insulating layer covering the main surface of the channel layer and not covering the main surfaces of the source electrode and the drain electrode is advantageous in terms of decreasing the parasitic capacitance of the semiconductor device and increasing the field-effect mobility and the reliability under light irradiation of the semiconductor device. When the semiconductor device further includes the second insulating layer covering the main surface of the channel layer and not covering the main surfaces of the source electrode and the drain electrode, at least one embodiment of the semiconductor device does not necessarily need to have an insulating layer covering the main surfaces of the source electrode and the drain electrode.

[8] When the semiconductor device of the present embodiment further includes the second insulating layer covering the main surface of the channel layer and not covering the main surfaces of the source electrode and the drain electrode, another embodiment of the semiconductor device can further include a low oxygen insulating layer that is an insulating layer covering the main surfaces of the source electrode and the drain electrode and is lower in oxygen atom content rate than the second insulating layer. This is also advantageous in terms of increasing the field-effect mobility and the reliability under light irradiation of the semiconductor device.

[9] Preferably, in the semiconductor device of the present embodiment, the first oxide semiconductor contains hexavalent tungsten. This is advantageous in terms of increasing the field-effect mobility of the semiconductor device.

[10] In the semiconductor device of the present embodiment, the channel layer can further contain zirconium. A content of the zirconium is preferably not smaller than $1 \times 10^{17}$ atms/cm$^3$ and not larger than $1 \times 10^{20}$ atms/cm$^3$. Containing zirconium at the above-described content is advantageous in terms of increasing the reliability under light irradiation of the semiconductor device.

[11] A method for manufacturing a semiconductor device which is another embodiment of the present invention is a method for manufacturing the semiconductor device according to the above-described embodiment, including: forming the gate electrode; forming a layer including an oxide semiconductor; forming a partially covering insulating layer covering a part of a main surface of the layer including the oxide semiconductor; and performing heat treatment after forming the partially covering insulating layer. According to the method for manufacturing the semiconductor device of the present embodiment, a semiconductor device having low parasitic capacitance, showing high field-effect mobility, and further, showing high field-effect mobility and high reliability under light irradiation can be manufactured relatively easily. The above-described oxide semiconductor corresponds to the first oxide semiconductor and the second oxide semiconductor included in the semiconductor device according to the above-described embodiment.

[12] The method for manufacturing the semiconductor device of the present embodiment can further include forming a low oxygen insulating layer covering a region adjacent to the part of the main surface of the layer including the oxide semiconductor, after forming the layer including the oxide semiconductor and before performing heat treatment. The low oxygen insulating layer is a layer that is lower in oxygen atom content rate than the partially covering insulating layer. Further inclusion of forming the low oxygen insulating layer is advantageous in terms of achieving the semiconductor device having high field-effect mobility and further having high reliability under light irradiation.

[13] In the method for manufacturing the semiconductor device of the present embodiment, the partially covering insulating layer can be the first insulating layer or a second insulating layer different from the first insulating layer. One example of the semiconductor device in which the partially covering insulating layer is the first insulating layer is a top gate-type TFT. One example of the semiconductor device in which the partially covering insulating layer is the second insulating layer is a bottom gate-type TFT. According to the method for manufacturing the semiconductor device of the present embodiment including forming the partially covering insulating layer that is the first insulating layer or the second insulating layer different from the first insulating layer, a semiconductor device having low parasitic capacitance, high field-effect mobility and further high reliability under light irradiation can be manufactured relatively easily.

[14] Preferably, in forming the partially covering insulating layer included in the method for manufacturing the semiconductor device of the present embodiment, the partially covering insulating layer is patterned by self alignment using the gate electrode. As a result, the need to separately use a photomask is eliminated, and thus, the semiconductor device can be easily manufactured at low cost and the parasitic capacitance of the obtained semiconductor device can be decreased.

[15] Preferably, performing heat treatment included in the method for manufacturing the semiconductor device of the present embodiment includes performing heat treatment at a temperature of not lower than 100° C. and not higher than 500° C. Inclusion of the above-described step can decrease the parasitic capacitance of the obtained semiconductor device, and is advantageous in terms of achieving the semiconductor device having high field-effect mobility and further having high reliability under light irradiation.

Details of Embodiments of the Present Invention

First Embodiment: Semiconductor Device

A semiconductor device of the present embodiment includes: a gate electrode; a channel layer arranged in a region directly below or directly above the gate electrode; a source electrode and a drain electrode arranged to be in contact with the channel layer; and a first insulating layer arranged between the gate electrode and the channel layer, the channel layer includes a first oxide semiconductor, at least one of the source electrode and the drain electrode includes a second oxide semiconductor, and the first oxide semiconductor and the second oxide semiconductor contain indium (In), tungsten (W) and zinc (Zn). The semiconductor device is specifically a TFT (thin-film transistor). An electric resistivity of the channel layer is preferably higher than an electric resistivity of the source electrode and the drain electrode.

In the semiconductor device of the present embodiment in which the channel layer is arranged in the region directly below or directly above the gate electrode, the above-described superimposing structure of the electrodes included in a conventional semiconductor device can be eliminated, and thus, the parasitic capacitance can be decreased. The matter that the channel layer is arranged in the region directly below or directly above the gate electrode means that a length 15 of a channel layer 7 is equal to a width 12 of a gate electrode 2 when the semiconductor device is viewed from above, as shown in FIG. 1. Therefore, in this case, an interface position between channel layer 7 and a source electrode 5 as well as an interface position between channel layer 7 and a drain electrode 6 are equal to positions of end faces of gate electrode 2. When channel layer 7 is arranged in the region directly below or directly above gate electrode 2, a distance 13 of gate electrode 2 does not necessarily need to be equal to a width 14 of channel layer 7. Such structure that channel layer 7 is arranged in the region directly below or directly above gate electrode 2 can be formed by the self alignment technique using patterned gate electrode 2, as described below.

The semiconductor device of the present embodiment can be, for example, of bottom gate type, of top gate type or the like. The case in which the channel layer is arranged in the region directly above the gate electrode refers to, for example, the case in which the semiconductor device is of bottom gate type. The case in which the channel layer is arranged in the region directly below the gate electrode refers to, for example, the case in which the semiconductor device is of top gate type.

Figure 2:
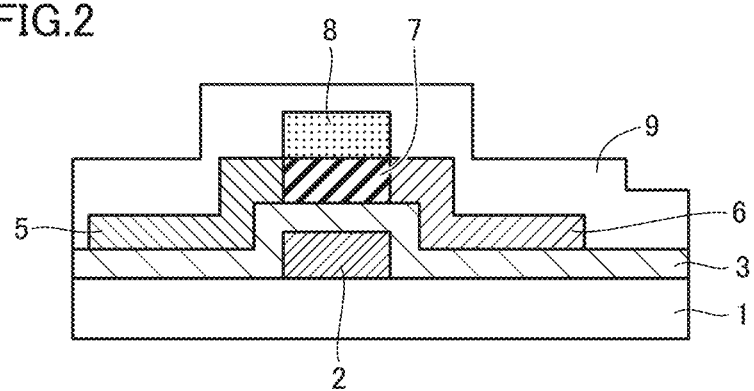
FIG. 2 is a schematic cross-sectional view showing one example of a semiconductor device according to one embodiment of the present invention.

FIG. 2 is a schematic cross-sectional view showing one example of a semiconductor device according to one embodiment of the present invention, and shows one example of a bottom gate-type semiconductor device (TFT). The semiconductor device shown in FIG. 2 includes a substrate 1, a gate electrode 2 arranged on substrate 1, a channel layer 7 arranged in a region directly above gate electrode 2, a source electrode 5 and a drain electrode 6 arranged to be in contact with channel layer 7, and a first insulating layer (gate insulating layer) 3 arranged between gate electrode 2 and channel layer 7. Source electrode 5 and drain electrode 6 are arranged on first insulating layer 3 so as not to be in contact with each other. An electric resistivity of channel layer 7 is higher than an electric resistivity of source electrode 5 and drain electrode 6. A second insulating layer (insulating protective layer) 8 also called "etching stopper layer", "passivation layer" or the like is stacked on channel layer 7. In the semiconductor device shown in FIG. 2, second insulating layer (insulating protective layer) 8 is not stacked on source electrode 5 and drain electrode 6. Although the semiconductor device shown in FIG. 2 includes a third insulating layer (insulating protective layer) 9 arranged on second insulating layer 8 and on source electrode 5 and drain electrode 6, third insulating layer 9 may be omitted. Gate electrode 2 may be stacked on substrate 1 with another layer interposed therebetween. Source electrode 5 and drain electrode 6 can also be used as pixel electrodes.

When the semiconductor device shown in FIG. 2 is viewed from above, a length of channel layer 7 is equal to a width of gate electrode 2. More specifically, when the semiconductor device is viewed from above, channel layer 7 is arranged in the region directly above gate electrode 2. Therefore, an interface position between channel layer 7 and source electrode 5 as well as an interface position between channel layer 7 and drain electrode 6 are equal to positions of end faces of gate electrode 2. As a result, the semiconductor device shown in FIG. 2 can show a decreased parasitic capacitance.

Figure 3:
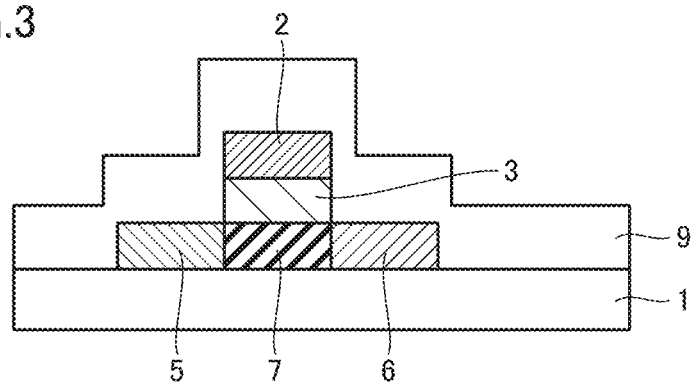
FIG. 3 is a schematic cross-sectional view showing another example of the semiconductor device according to one embodiment of the present invention.

FIG. 3 is a schematic cross-sectional view showing another example of the semiconductor device according to one embodiment of the present invention, and shows one example of a top gate-type semiconductor device (TFT). The semiconductor device shown in FIG. 3 includes substrate 1, channel layer 7 arranged on substrate 1, gate electrode 2 arranged in a region directly above channel layer 7, source electrode 5 and drain electrode 6 arranged to be in contact with channel layer 7, and first insulating layer (gate insulating layer) 3 arranged between gate electrode 2 and channel layer 7. Source electrode 5 and drain electrode 6 are arranged on substrate 1 so as not to be in contact with each other. An electric resistivity of channel layer 7 is higher than an electric resistivity of source electrode 5 and drain electrode 6. Although the semiconductor device shown in FIG. 3 includes third insulating layer (insulating protective layer) 9 arranged on gate electrode 2 and on source electrode 5 and drain electrode 6, third insulating layer 9 may be omitted. Channel layer 7 as well as source electrode 5 and drain electrode 6 may be stacked on substrate 1 with another layer interposed therebetween. Source electrode 5 and drain electrode 6 can also be used as pixel electrodes.

When the semiconductor device shown in FIG. 3 is viewed from above, a length of channel layer 7 is equal to a width of gate electrode 2. More specifically, when the semiconductor device is viewed from above, channel layer 7 is arranged in the region directly below gate electrode 2. Therefore, an interface position between channel layer 7 and source electrode 5 as well as an interface position between channel layer 7 and drain electrode 6 are equal to positions of end faces of gate electrode 2. As a result, the semiconductor device shown in FIG. 3 can show a decreased parasitic capacitance.

In the semiconductor device of the present embodiment, channel layer 7 includes a first oxide semiconductor, and at least one (preferably both) of source electrode 5 and drain electrode 6 includes a second oxide semiconductor, and these first and second oxide semiconductors contain In, W and Zn.

In the semiconductor device of the present embodiment, a content rate of W (W content rate) to a total of In, W and Zn in the first oxide semiconductor and the second oxide semiconductor is higher than 0.001 atomic % and not higher than 8.0 atomic %, a content rate of Zn (Zn content rate) to the total of In, W and Zn in the first oxide semiconductor and the second oxide semiconductor is not lower than 1.2 atomic % and not higher than 40 atomic %, and an atomic ratio of Zn to W (Zn/W ratio) in the first oxide semiconductor and the second oxide semiconductor is higher than 1.0 and lower than 20000. The semiconductor device of the present embodiment can decrease the parasitic capacitance, and can show high field-effect mobility. Furthermore, the semiconductor device of the present embodiment is also advantageous in terms of increasing the reliability under light irradiation.

Channel layer 7 is preferably a layer consisting of the first oxide semiconductor, and source electrode 5 and drain electrode 6 are preferably layers consisting of the second oxide semiconductor.

Content rates of In, W and Zn in the first oxide semiconductor included in channel layer 7 are preferably the same as content rates of In, W and Zn in the second oxide semiconductor included in source electrode 5 and/or drain electrode 6, respectively. As a result, particularly when channel layer 7, source electrode 5 and drain electrode 6 are separately formed by self alignment using gate electrode 2, the manufacturing process of the semiconductor device can be simplified.

The content rates of In, W and Zn are measured by TEM-EDX (a transmission electron microscope with an energy-dispersive X-ray fluorescence spectrometer) or RBS (Rutherford backscattering analysis). The content rates of In, W and Zn in the first oxide semiconductor and the content rates of In, W and Zn in the second oxide semiconductor are measured by quantitatively analyzing a part of channel layer 7 (first oxide semiconductor) and a part of source electrode 5 and/or drain electrode 6 (second oxide semiconductor) using the aforementioned method.

The content rate of In (hereinafter also referred to as "In content rate") is defined by the following equation:

In content rate (atomic %)={In content/(In content+W content+Zn content)}×100.

The content rate of W (hereinafter also referred to as "W content rate") is defined by the following equation:

W content rate (atomic %)={W content/(In content+W content+Zn content)}×100.

The content rate of Zn (hereinafter also referred to as "Zn content rate") is defined by the following equation:

Zn content rate (atomic %)={Zn content/(In content+W content+Zn content)}×100.

When the above-described W content rate is higher than 0.001 atomic % and lower than 0.5 atomic %, it may be difficult to estimate the atomic % by TEM-EDX or RBS. In this case, the number of atoms of W per 1 cm$^3$ is measured by SIMS (secondary ion mass spectrometer). For example, when the number of atoms of W per 1 cm$^3$ is $1.5\times10^{20}$/cm$^3$, the W content rate is 0.5 atomic %. For example, when the number of atoms of W per 1 cm$^3$ is $1.5\times10^{19}$/cm$^3$, the W content rate is 0.05 atomic %. A relationship between the number of atoms of W per 1 cm$^3$ and the W content rate (atomic %) is as expressed by the following equation:

W content rate=the number of atoms of W per 1 cm$^3$ by SIMS/($3\times10^{22}$)×100%.

As far as the W content rate is concerned, when a difference between the content rate in source electrode 5 and/or drain electrode 6 (second oxide semiconductor) and the content rate in channel layer 7 (first oxide semiconductor) is within the range of ±20% with respect to channel layer 7 (first oxide semiconductor)={(first oxide semiconductor layer−second oxide semiconductor layer)/first oxide semiconductor layer×100%)}, both content rates are determined to be the same. As far as the In content rate and the Zn content rate are concerned, when a difference between the content rate in source electrode 5 and/or drain electrode 6 (second oxide semiconductor) and the content rate in channel layer 7 (first oxide semiconductor) is within the range of ±30% with respect to channel layer 7 (first oxide semiconductor)={(first oxide semiconductor layer−second oxide semiconductor layer)/first oxide semiconductor layer× 100%)}, both content rates are determined to be the same.

In the semiconductor device according to the present embodiment, the W content rate in channel layer 7 (first oxide semiconductor) is preferably higher than 0.001 atomic % and not higher than 8.0 atomic %, and the Zn content rate is preferably not lower than 1.2 atomic % and not higher than 40 atomic %, and an atomic ratio of Zn to W, i.e., a ratio of the Zn content rate to the W content rate (Zn content rate/W content rate, and hereinafter also referred to as "Zn/W ratio") is preferably higher than 1.0 and lower than 20000. As a result, the field-effect mobility of the semiconductor device can be increased, and further, the reliability under light irradiation of the semiconductor device can also be increased.

In the semiconductor device according to the present embodiment, the W content rate in source electrode 5 and drain electrode 6 (second oxide semiconductor) is preferably higher than 0.001 atomic % and not higher than 8.0 atomic %, and the Zn content rate is preferably not lower than 1.2 atomic % and not higher than 40 atomic %, and the Zn/W ratio is preferably higher than 1.0 and lower than 20000. The use of such source electrode 5 and drain electrode 6 is advantageous in terms of achieving the semiconductor device showing high field-effect mobility and high reliability under light irradiation, and is also advantageous in terms of decreasing the electric resistivity of source electrode 5 and drain electrode 6.

From the perspective of increasing the field-effect mobility and the reliability under light irradiation, the W content rates in channel layer 7 (first oxide semiconductor) and in source electrode 5 and drain electrode 6 (second oxide semiconductor) are more preferably not lower than 0.01 atomic % and further preferably not lower than 0.08 atomic %, and more preferably not higher than 5 atomic % and further preferably not higher than 3 atomic %. When the W content rates are not higher than 0.001 atomic %, there is a tendency that a threshold voltage $V_{th}$ characteristic, which is one of the important characteristics of the semiconductor device, is not good, and the reliability under light irradiation of the semiconductor device may also decrease. From the perspective of ease of device control, it is desired that the semiconductor device such as a TFT has threshold voltage $V_{th}$ of not lower than 0 V and not higher than 5 V. When the W content rates exceed 8 atomic %, there is a tendency that it is difficult to obtain an excellent field-effect mobility. When source electrode 5 and/or drain electrode 6 having a W content rate exceeding 8 atomic % is/are used, reduction in electric resistivity of these electrodes is likely to become difficult. The W content rates in channel layer 7 (first oxide semiconductor) and in source electrode 5 and drain electrode 6 (second oxide semiconductor) are desirably not higher than 0.5 atomic %, from the perspective of increasing the reliability under light irradiation.

The feature that the Zn content rates in channel layer 7 (first oxide semiconductor) and in source electrode 5 and drain electrode 6 (second oxide semiconductor) are not lower than 1.2 atomic % and not higher than 40 atomic %, and the Zn/W ratios are higher than 1.0 and lower than 20000 is advantageous in terms of achieving the semiconductor device showing high field-effect mobility and high reliability under light irradiation.

From the perspective of increasing the field-effect mobility and the reliability under light irradiation, the Zn content rates in channel layer 7 (first oxide semiconductor) and in source electrode 5 and drain electrode 6 (second oxide semiconductor) are more preferably not lower than 3 atomic % and further preferably not lower than 10 atomic %, and more preferably not higher than 25 atomic % and further preferably not higher than 18 atomic %. When the Zn content rates are lower than 1.2 atomic %, the reliability under light irradiation of the semiconductor device may decrease. When the Zn content rates exceed 40 atomic %, there is a tendency that it is difficult to obtain an excellent field-effect mobility.

When the Zn/W ratios in channel layer 7 (first oxide semiconductor) and in source electrode 5 and drain electrode 6 (second oxide semiconductor) are not higher than 1.0, the reliability under light irradiation of the semiconductor device may decrease. The Zn/W ratios are more preferably not lower than 3.0, and further preferably not lower than 5.0. When the Zn/W ratios in channel layer 7 (first oxide semiconductor) and in source electrode 5 and drain electrode 6 (second oxide semiconductor) are not lower than 20000, there is a tendency that it is difficult to obtain an excellent field-effect mobility. The Zn/W ratios are more preferably not higher than 500, and further preferably not higher than 300. The Zn/W ratios may be not lower than 80.

From the perspective of increasing the field-effect mobility, In/(In+Zn) atomic ratios in channel layer 7 (first oxide semiconductor) and in source electrode 5 and drain electrode 6 (second oxide semiconductor) are preferably higher than 0.8.

The reliability of the semiconductor device will now be described. Generally, the reliability under light irradiation of a semiconductor device including an oxide semiconductor may vary depending on a temperature of heat treatment during manufacturing of the semiconductor device. By increasing the heat treatment temperature, the reliability can be increased. Generally, however, when the heat treatment temperature is increased, the field-effect mobility decreases. Therefore, it has been desired that the field-effect mobility does not decrease even when the heat treatment temperature is high. In the present specification, "high field-effect mobility and high reliability under light irradiation" means that the field-effect mobility does not decrease even when the heating treatment temperature is high, and high reliability under light irradiation is obtained due to high heating treatment temperature.

The electric resistivity of channel layer 7 is preferably not lower than $10^{-1}$ Ωcm, and the electric resistivity of source electrode 5 and drain electrode 6 is preferably not higher than $10^{-2}$ Ωcm.

An indium-containing oxide is known as a transparent electroconductive film. As described in Japanese Patent Laying-Open No. 2002-256424, for example, it is common to use a film having an electric resistivity lower than $10^{-1}$ Ωcm as a film for the transparent electroconductive film. Therefore, the electric resistivity of source electrode 5 and drain electrode 6 in the semiconductor device of the present embodiment is also preferably low, and is more preferably not higher than $10^{-2}$ Ωcm. On the other hand, the electric resistivity of channel layer 7 in the semiconductor device of the present embodiment is desirably not lower than $10^{-1}$ Ωcm. In order to achieve this electric resistivity, it is preferable to comprehensively consider the W content rate, the Zn content rate and the Zn/W ratio of channel layer 7.

From the perspective of increasing the field-effect mobility and the reliability under light irradiation of the semiconductor device, the first oxide semiconductor forming channel layer 7 is preferably composed of nanocrystalline oxide or amorphous oxide. From the same perspective, the second oxide semiconductor forming source electrode 5 and drain electrode 6 is preferably composed of nanocrystalline oxide or amorphous oxide.

In the present specification, "nanocrystalline oxide" refers to an oxide in which a peak caused by the crystals is not observed and only a broad peak called "halo" appearing on the low angle side is observed by X-ray diffraction measurement in accordance with the following conditions, and in which a ring-like pattern is observed when transmission electron beam diffraction measurement of a minute region is performed by using a transmission electron microscope in accordance with the following conditions. The ring-like pattern includes the case in which spots gather to form the ring-like pattern.

In the present specification, "amorphous oxide" refers to an oxide in which a peak caused by the crystals is not observed and only a broad peak called "halo" appearing on the low angle side is observed by X-ray diffraction measurement in accordance with the following conditions, and in which an obscure pattern called "halo" is again observed when transmission electron beam diffraction measurement of a minute region is performed by using a transmission electron microscope in accordance with the following conditions.

(X-Ray Diffraction Measurement Conditions)
Measurement method: In-plane method (slit collimation method)
X-ray generating portion: anticathode Cu, output of 50 kV, 300 mA
Detecting portion: scintillation counter
Incidence portion: slit collimation
Solar slit: incidence side longitudinal divergence angle of 0.48°
light receiving side longitudinal divergence angle of 0.41°
Slit: incidence side S1=1 mm*10 mm
light receiving side S2=0.2 mm*10 mm
Scanning condition: scanning axis of 2θχ/φ
Scanning mode: step measurement, scanning range of 10 to 80°, step width of 0.1°, step time of 8 sec.

(Transmission Electron Beam Diffraction Measurement Conditions)
Measurement method: microscopic electron beam diffraction method
Accelerating voltage: 200 kV
Beam diameter: same as or equivalent to a film thickness of a layer including an oxide semiconductor to be measured In the case where the first oxide semiconductor and/or the second oxide semiconductor is/are composed of nanocrystalline oxide, the ring-like pattern is observed as described above and a spot-like pattern is not observed when transmission electron beam diffraction measurement of a minute region is performed in accordance with the aforementioned conditions. In contrast, an oxide semiconductor layer disclosed in Japanese Patent No. 5172918, for example, includes c-axis oriented crystals along the direction perpendicular to the surface of the layer, and when the nanocrystals in a minute region are oriented in a certain direction as described above, the spot-like pattern is observed. In the case where the first oxide semiconductor and/or the second oxide semiconductor is/are composed of nanocrystalline oxide, the nanocrystals have a non-orientation property, i.e., the nanocrystals are not oriented with respect to the surface of the layer, and have random orientation, when a surface (layer cross section) perpendicular to the layer surface is at least observed. In other words, the crystal axis is not oriented with respect to the film thickness direction.

The feature that the first oxide semiconductor forming channel layer 7, and in addition to this, the second oxide semiconductor forming source electrode 5 and drain electrode 6 are composed of nanocrystalline oxide or amorphous oxide is advantageous in terms of increasing the field-effect mobility of the semiconductor device. From the perspective of increasing the field-effect mobility, the first oxide semiconductor and the second oxide semiconductor are more preferably composed of amorphous oxide.

When the above-described Zn content rate is not lower than 10 atomic % and/or the W content rate is not lower than 0.4 atomic %, the first oxide semiconductor and the second oxide semiconductor are likely to become amorphous oxide and the amorphous oxide is stable even when the heating treatment temperature is higher.

From the perspective of increasing the field-effect mobility, in the semiconductor device of the present embodiment, the first oxide semiconductor forming channel layer 7 preferably contains W in which a peak position of the bonding energy measured using X-ray photoelectron spectroscopy (XPS) is not less than 32.9 eV and not more than 36.5 eV. The peak position of the bonding energy is more preferably not less than 34 eV and not more than 36.5 eV, and further preferably not less than 35 eV and not more than 36.5 eV.

In X-ray photoelectron spectroscopy (XPS), a peak of the bonding energy of $WO_3$ having hexavalent W is known to appear in the range of not less than 35 eV and not more than 36.5 eV, and a peak of the bonding energy of tungsten metal and $WO_2$ having tetravalent tungsten is known to appear in the range of not less than 32 eV and not more than 33.5 eV. Therefore, from the perspective of increasing the field-effect mobility, the first oxide semiconductor preferably contains hexavalent W.

From the perspective of increasing the field-effect mobility of the semiconductor device, the second oxide semiconductor forming source electrode 5 and drain electrode 6 also preferably contains W in which a peak position of the bonding energy measured using X-ray photoelectron spectroscopy (XPS) is not less than 32.9 eV and not more than 36.5 eV, more preferably contains W in which the peak position of the bonding energy is not less than 34 eV and not more than 36.5 eV, and further preferably contains W in which the peak position of the bonding energy is not less than 35 eV and not more than 36.5 eV. In addition, the second oxide semiconductor preferably contains hexavalent W.

In the semiconductor device of the present embodiment, channel layer 7 preferably further contains zirconium (Zr) and a content thereof is preferably not smaller than $1\times10^{17}$ atms/cm$^3$ and not larger than $1\times10^{20}$ atms/cm$^3$. As a result, the reliability under light irradiation of the semiconductor device can be increased. Generally, Zr is often applied to an oxide semiconductor for the purpose of increasing heat stability, heat resistance and chemical resistance or decreasing an S value and an OFF current. In the present invention, however, it has been newly found that the reliability under light irradiation can be increased by using Zr together with W and Zn. The Zr content in channel layer 7 is obtained as the number of atoms per 1 cm$^3$ in channel layer 7 by analyzing an arbitrary point of channel layer 7 in the depth direction using secondary ion mass spectrometry (SIMS).

When the Zr content is smaller than $1\times10^{17}$ atms/cm$^3$, the reliability under light irradiation is not increased. When the Zr content is larger than $1\times10^{20}$ atms/cm$^3$, the reliability under light irradiation tends to decrease. From the perspective of increasing the reliability under light irradiation, the Zr content is more preferably not smaller than $1\times10^{18}$ atms/cm$^3$, and more preferably not larger than $1\times10^{19}$ atms/cm$^3$.

From the perspective of increasing the field-effect mobility of the semiconductor device, source electrode 5 and drain electrode 6 also preferably further contain Zr and a content thereof is preferably not smaller than $1\times10^{17}$ atms/cm$^3$ and not larger than $1\times10^{20}$ atms/cm$^3$.

A content rate of unavoidable metals other than In, W and Zn to the total of In, W and zinc Zn in channel layer 7 as well as source electrode 5 and drain electrode 6 is preferably not higher than 1 atomic %.

From the perspective of increasing the field-effect mobility of the semiconductor device, a film thickness of each of channel layer 7 as well as source electrode 5 and drain electrode 6 is preferably not smaller than 2 nm and not greater than 100 nm, and more preferably not smaller than 5 nm and not greater than 80 nm.

Channel layer 7 as well as source electrode 5 and drain electrode 6 can, for example, be formed by a method for integrally forming, on substrate 1, a layer including an oxide semiconductor forming channel layer 7 as well as source electrode 5 and drain electrode 6, and separately forming channel layer 7, source electrode 5 and drain electrode 6 from this oxide semiconductor layer by self alignment. Hereinafter, the above-described layer including the oxide semiconductor will also be referred to as "oxide semiconductor layer". The oxide semiconductor layer is preferably a layer consisting of an oxide semiconductor. The oxide semiconductor layer may be directly formed on substrate 1, or may be formed on substrate 1 with another layer (e.g., first insulating layer 3) interposed therebetween. When channel layer 7 as well as source electrode 5 and drain electrode 6 are formed by the above-described method, the first oxide semiconductor and the second oxide semiconductor have the same composition. The oxide semiconductor layer can be obtained by a manufacturing method including the step of forming a film by the sputtering method. This is advantageous in terms of obtaining the semiconductor device having high field-effect mobility and high reliability under light irradiation. The oxide semiconductor layer forming channel layer 7 as well as source electrode 5 and drain electrode 6 is a transparent layer that allows ultraviolet rays applied to the resist layer used in the manufacturing process of the semiconductor device to pass therethrough. If source electrode 5 and drain electrode 6 are transparent, a light-blocked portion in each pixel decreases when the semiconductor device is applied to, for example, an image display apparatus, and thus, an aperture ratio can be increased.

The sputtering method refers to a method for forming the film constituted by the atoms forming a target, by arranging the target and a substrate in a film formation chamber to face each other, applying a voltage to the target, and sputtering a surface of the target with a noble gas ion, thereby releasing the atoms forming the target from the target and depositing the atoms on the substrate.

In addition to the sputtering method, a pulsed laser deposition (PLD) method, a heating deposition method and the like are proposed as a method for forming the oxide semiconductor layer. For the aforementioned reasons, however, the use of the sputtering method is preferable.

A magnetron sputtering method, a facing target-type sputtering method and the like can be used as the sputtering method. As the atmospheric gas during sputtering, an Ar gas, a Kr gas and a Xe gas can be used, and a mixture of these gases with an oxygen gas can also be used.

When the oxide semiconductor layer is formed by the sputtering method, the heat treatment may be performed after film formation by the sputtering method, or the heat treatment may be performed during film formation by the sputtering method. As a result, the oxide semiconductor layer composed of nanocrystalline oxide or amorphous oxide is easily obtained. The above-described heat treatment is also advantageous in terms of achieving the semiconductor device having high field-effect mobility and reliability under light irradiation.

A method for heat treatment performed during film formation by the sputtering method is not particularly limited, and examples of the method can include heating treatment by lamp irradiation, an electric resistive element, a laser beam and the like. A substrate temperature is preferably not lower than 100° C. and not higher than 250° C. The heating treatment time corresponds to the film formation time and the film formation time depends on a film thickness of the oxide semiconductor layer to be formed. However, the film formation time can be, for example, approximately 1 second to 10 minutes. The heat treatment performed after film formation by the sputtering method is not particularly limited, either, and can be heating treatment by lamp irradiation, an electric resistive element, a laser beam and the like.

Especially, the method for manufacturing the semiconductor device of the present embodiment preferably includes the step of performing heat treatment after forming the oxide semiconductor layer, and more preferably includes the step of performing heat treatment under the presence of an insulating layer arranged at a prescribed position, in order to integrally form the oxide semiconductor layer and separately form channel layer 7, source electrode 5 and drain electrode 6 from this oxide semiconductor layer. The method for manufacturing the semiconductor device including the above-described step of performing heat treatment will be described below.

Next, gate electrode 2 will be described. Gate electrode 2 can be, for example, an electrode of a single layer structure composed of a metal such as Ti, Al, Mo, W, or Cu, or an electrode of a multilayer structure in which two or more of these metals are used. When the semiconductor device is of bottom gate type, gate electrode 2 is preferably made of a material that can block ultraviolet rays applied to the resist layer used in the manufacturing process of the semiconductor device, in order to separately form channel layer 7, source electrode 5 and drain electrode 6 by the self alignment technique using gate electrode 2 to thereby manufacture the semiconductor device.

Next, the insulating layers that may be included in the semiconductor device of the present embodiment will be described. In both of the bottom gate type shown in FIG. 2 and the top gate type shown in FIG. 3, the semiconductor device at least has, as a gate insulating layer, first insulating layer 3 arranged between gate electrode 2 and channel layer 7. As shown in FIG. 2, the bottom gate-type semiconductor device can further have second insulating layer (insulating protective layer) 8 also called "etching stopper layer", "passivation layer" or the like that covers a main surface (main surface opposite to first insulating layer 3) of channel layer 7. In addition, as shown in FIGS. 2 and 3, the semiconductor device can further have third insulating layer (insulating protective layer) 9 covering a surface of the semiconductor device. Third insulating layer (insulating protective layer) 9 is an arbitrary insulating layer provided as necessary.

From the viewpoint of the arrangement positions of the insulating layers, the semiconductor device obtained by integrally forming the oxide semiconductor layer and separately forming channel layer 7, source electrode 5 and drain electrode 6 from this oxide semiconductor layer can be classified into, for example, the following types:

(X) a semiconductor device including a high oxygen insulating layer (partially covering insulating layer) covering the main surface of channel layer 7 and not covering the main surfaces of source electrode 5 and drain electrode 6, and not including an insulating layer covering the main surfaces of source electrode 5 and drain electrode 6, in the heat treatment step performed after the above-described oxide semiconductor layer is formed; and (Y) a semiconductor device including a high oxygen insulating layer (partially covering insulating layer) covering the main surface of channel layer 7 and not covering the main surfaces of source electrode 5 and drain electrode 6, and including a low oxygen insulating layer covering the main surfaces of source electrode 5 and drain electrode 6, in the heat treatment step performed after the above-described oxide semiconductor layer is formed.

The high oxygen insulating layer in the types (X) and (Y) refers to an insulating layer that can suppress desorption of oxygen from the oxide semiconductor layer occurring during heat treatment, or can diffuse oxygen into the oxide semiconductor layer. The oxide semiconductor layer covered with the high oxygen insulating layer allows suppression of desorption of oxygen or is supplied with oxygen from the high oxygen insulating layer during heat treatment, and thus, becomes a layer serving as the channel layer. One example of the high oxygen insulating layer is an insulating layer that is larger in number of oxygen atoms per unit volume than the oxide semiconductor layer. The number of oxygen atoms per unit volume in the oxide semiconductor layer is obtained as follows. First, quantities of the elements present in the oxide semiconductor layer are determined with TEM-EDX (a transmission electron microscope with an energy-dispersive X-ray fluorescence spectrometer), and a ratio of each atom (atom content ratio) forming the oxide semiconductor layer is obtained in accordance with the following equation:

atom content ratio=content of target atom/content of all atoms present in oxide semiconductor layer.

A total of the atom content ratios for all atoms is 1. Next, based on a film density of the oxide semiconductor layer and the content ratios of all constituent atoms, the number of oxygen atoms per unit volume can be obtained in accordance with the following equation:

the number of oxygen atoms per unit volume=oxygen atom content ratio (value assuming that the total is 1)×Avogadro's number×film density/{value obtained by summing (atomic weight of target atom forming oxide semiconductor layer×content ratio of target atom (value assuming that the total is 1) with respect to all constituent atoms}; or the number of oxygen atoms per unit volume=oxygen atom content ratio (value assuming that the total is 1)×the number of atoms included in the film per unit volume.

The number of atoms included in the film per unit volume can be measured by RBS. The film density is calculated using 6.8 g/cm$^3$ for the sake of simplicity.

For example, when the constituent atoms of the oxide semiconductor layer are In, W, Zn, and O, and when $A_{In}$ represents a content ratio of In, $A_W$ represents a content ratio of W, $A_{Zn}$ represents a content ratio of Zn, and $A_O$ represents a content ratio of O, the number of oxygen atoms per unit volume in the oxide semiconductor layer can be obtained in accordance with the following equation:

the number of oxygen atoms per unit volume=$A_O$×Avogadro's number×6.8/{$A_{In}$×In atomic weight (114.82)+$A_W$×W atomic weight (188.84)+$A_{Zn}$×Zn atomic weight (65.39)+$A_O$×oxygen atomic weight (16.0)}.

$A_{In}$, $A_W$, $A_{Zn}$, and $A_O$ can be obtained by TEM-EDX measurement.

Similarly to the above-described method for calculating the number of oxygen atoms per unit volume in the oxide semiconductor layer, the number of oxygen atoms per unit volume in the high oxygen insulating layer can be calculated from a composition formula of an insulating material forming the high oxygen insulating layer. When the number of oxygen atoms per unit volume in the oxide semiconductor layer is smaller than the number of oxygen atoms per unit volume in the insulating layer, this insulating layer can be recognized as a high oxygen insulating layer.

A layer that is made of a material having an insulation property and a dielectric constant and has a relatively high oxygen atom content rate may be a high oxygen insulating layer. An insulating layer such as an $SiO_x$ layer (x≥1.5), an $SiO_xN_y$ layer (x≥1.5) or an $AlO_x$ layer (x≥1.5) may be a high oxygen insulating layer, regardless of the above-described determination based on comparison of the number of oxygen atoms per unit volume. From the perspective of the reliability under light irradiation of the semiconductor device, the high oxygen insulating layer is preferably an $SiO_x$ layer (x≥1.5). In the case of the bottom gate type, the reliability under light irradiation can be further increased when an $SiN_x$ layer is stacked on this $SiO_x$ layer.

The low oxygen insulating layer in the type (Y) refers to a layer that cannot suppress desorption of oxygen from the oxide semiconductor layer occurring during heat treatment. When desorption of oxygen occurs, the oxide semiconductor layer covered with the low oxygen insulating layer decreases in electric resistivity and becomes an electroconductive film. As far as a relationship between the high oxygen insulating layer and the low oxygen insulating layer is concerned, the low oxygen insulating layer may be defined as an insulating layer that is lower in oxygen atom content rate than the high oxygen insulating layer. One example of the low oxygen insulating layer is an insulating layer that is smaller in number of oxygen atoms per unit volume than the oxide semiconductor layer. The number of oxygen atoms per unit volume in the low oxygen insulating layer can be calculated by the above-described method. The number of oxygen atoms per unit volume in the low oxygen insulating layer is smaller than that in the high oxygen insulating layer.

A layer that is made of a material having an insulation property and a dielectric constant and has a relatively low oxygen atom content rate may be a low oxygen insulating layer. An insulating layer such as an $SiO_xN_y$ layer (x<1.5), an $Al_2O_xN_y$ layer (x<3 and y>0) or an $SiN_x$ layer may be a low oxygen insulating layer, regardless of the above-described determination based on comparison of the number of oxygen atoms per unit volume. From the perspective of the reliability under light irradiation of the semiconductor device, the low oxygen insulating layer is preferably an $SiN_x$ layer.

In the case of the bottom gate-type semiconductor device, for example, the high oxygen insulating layer can be second insulating layer 8. This second insulating layer 8 may be a layer that is present in the above-described heat treatment step, and thereafter is removed and no longer present in the obtained semiconductor device. In the case of the top gate-type semiconductor device, for example, the high oxygen insulating layer can be first insulating layer (gate insulating layer) 3. However, the present invention is not limited to these examples and a plurality of types of insulating layers (e.g., first insulating layer 3 and second insulating layer 8) may serve as the high oxygen insulating layer. First insulating layer (gate insulating layer) 3 in the top gate-type semiconductor device and second insulating layer 8 in the bottom gate-type semiconductor device can be, for example, an $SiO_x$ layer (x≥1.5), an $SiO_xN_y$ layer (x≥1.5 and y<0.5) or an $Al_2O_3$ layer, preferably an $SiO_x$ layer (x≥1.5), and more preferably an $SiO_2$ layer.

The low oxygen insulating layer in the type (Y) can be, for example, third insulating layer 9 formed before the above-described heat treatment step. Third insulating layer 9 can be, for example, an $SiO_xN_y$ layer (x<1.5 and y>0.5), an $SiN_x$ layer or an $Al_2O_xN_y$ layer (x<3 and y>0), and is preferably an $SiN_x$ layer.

In the type (X), third insulating layer 9 is a layer that is not present in the above-described heat treatment step. However, the finally obtained semiconductor device may have third insulating layer 9. In the type (Y), third insulating layer 9 can be a low oxygen insulating layer, and in this case, third insulating layer 9 can be a layer that is lower in oxygen atom content rate than second insulating layer 8 (bottom gate type) or first insulating layer 3 (top gate type).

When the oxide semiconductor layer formed on substrate 1 is heat-treated in the above-described heat treatment step, a portion of the oxide semiconductor layer where the main surface thereof is covered with the high oxygen insulating layer (partially covering insulating layer) increases in electric resistivity and can show a semiconductor characteristic, and thus, this portion can be used as channel layer 7.

On the other hand, when the oxide semiconductor layer formed on substrate 1 is heat-treated in the above-described heat treatment step, a portion of the oxide semiconductor layer where the main surface thereof is not covered with the high oxygen insulating layer (partially covering insulating layer), or a portion of the oxide semiconductor layer where the main surface thereof is covered with the low oxygen insulating layer decreases in electric resistivity, and thus, this portion can be used as source electrode 5 or drain electrode 6. The method for separately forming channel layer 7, source electrode 5 and drain electrode 6 from the oxide semiconductor layer by the above-described heat treatment step is advantageous in terms of obtaining the semiconductor device having high field-effect mobility and reliability under light irradiation.

In the type (X), an insulating layer may be stacked on the uncovered main surfaces of source electrode 5 and drain electrode 6 after the above-described heat treatment step. Examples of the insulating layer can include an $SiO_x$ layer, an $SiO_xN_y$ layer, an $SiN_x$ layer, an $AlO_x$ layer, an $Al_2O_xN_y$ layer and the like. From the perspective of maintaining the low electric resistivity of source electrode 5 and drain electrode 6, the insulating layer is preferably an $SiN_x$ layer. As described above, the insulating layer may be third insulating layer 9.

A method for the above-described heat treatment performed after the oxide semiconductor layer is formed is not particularly limited, and can be heating treatment by lamp irradiation, an electric resistive element, a laser beam and the like. A heating temperature is preferably not lower than 100° C. and not higher than 500° C. In order to achieve high field-effect mobility, the heating temperature is more preferably not higher than 450° C., and further preferably not higher than 400° C. In order to achieve high reliability under light irradiation, the heating temperature is more preferably not lower than 200° C., and further preferably not lower than 300° C. From the perspective of achieving both high field-effect mobility and high reliability under light irradiation, the heating temperature is particularly preferably not lower than 300° C. and not higher than 500° C.

The atmosphere of the heat treatment may be various types of atmospheres such as in the air, in the nitrogen gas, in the nitrogen gas-oxygen gas, in the Ar gas, in the Ar-oxygen gas, in the water vapor-containing air, and in the water vapor-containing nitrogen, and is preferably in the nitrogen gas. The pressure in the atmosphere can be a pressure under reduced pressure conditions (e.g., lower than 0.1 Pa) or a pressure under increased pressure conditions (e.g., 0.1 Pa to 9 MPa), or the atmospheric pressure, and is preferably the atmospheric pressure. The heat treatment time can be, for example, approximately 0.01 seconds to 2 hours, and is preferably approximately 1 second to 10 minutes.

Second Embodiment: Method for Manufacturing Semiconductor Device

A method for manufacturing a semiconductor device according to the present embodiment is a method for manufacturing the semiconductor device according to the above-described first embodiment and is not particularly limited. However, from the perspective of efficiently and relatively easily manufacturing the semiconductor device according to the above-described first embodiment that may show high field-effect mobility and further may show high field-effect mobility and high reliability under light irradiation, the method for manufacturing the semiconductor device according to the present embodiment includes, for example, the following steps:

(1) forming the gate electrode;
(2) forming the layer including the oxide semiconductor (oxide semiconductor layer);
(3) forming the partially covering insulating layer covering a part of the main surface of the oxide semiconductor layer; and
(4) performing heat treatment performed after forming the partially covering insulating layer.

The method for manufacturing the semiconductor device according to the present embodiment can further include the step (5) of forming the low oxygen insulating layer covering a region adjacent to the above-described part of the main surface of the oxide semiconductor layer, after the step (3) and before the step (4).

In the method for manufacturing the semiconductor device according to the present embodiment including the above-described steps (1) to (4) (and further the step (5)), the channel layer, the source electrode and the drain electrode are separately formed from the oxide semiconductor layer using the partially covering insulating layer formed at a prescribed position, to thereby obtain the semiconductor device. The partially covering insulating layer formed at the prescribed position can be formed by the self alignment technique using the preliminarily fabricated gate electrode, and in turn, the channel layer, the source electrode and the drain electrode can be separately formed from the oxide semiconductor layer by this self alignment technique. According to the method for manufacturing the semiconductor device of the present embodiment including the above-described steps (1) to (4) (and further the step (5)), the bottom gate-type semiconductor device and the top gate-type semiconductor device can be both manufactured. The obtained semiconductor device is specifically a TFT (thin-film transistor). A method for manufacturing the bottom gate-type semiconductor device and a method for manufacturing the top gate-type semiconductor device will be described in more detail below with reference to the drawings.

<Method for Manufacturing Bottom Gate-Type Semiconductor Device>

Figure 4:
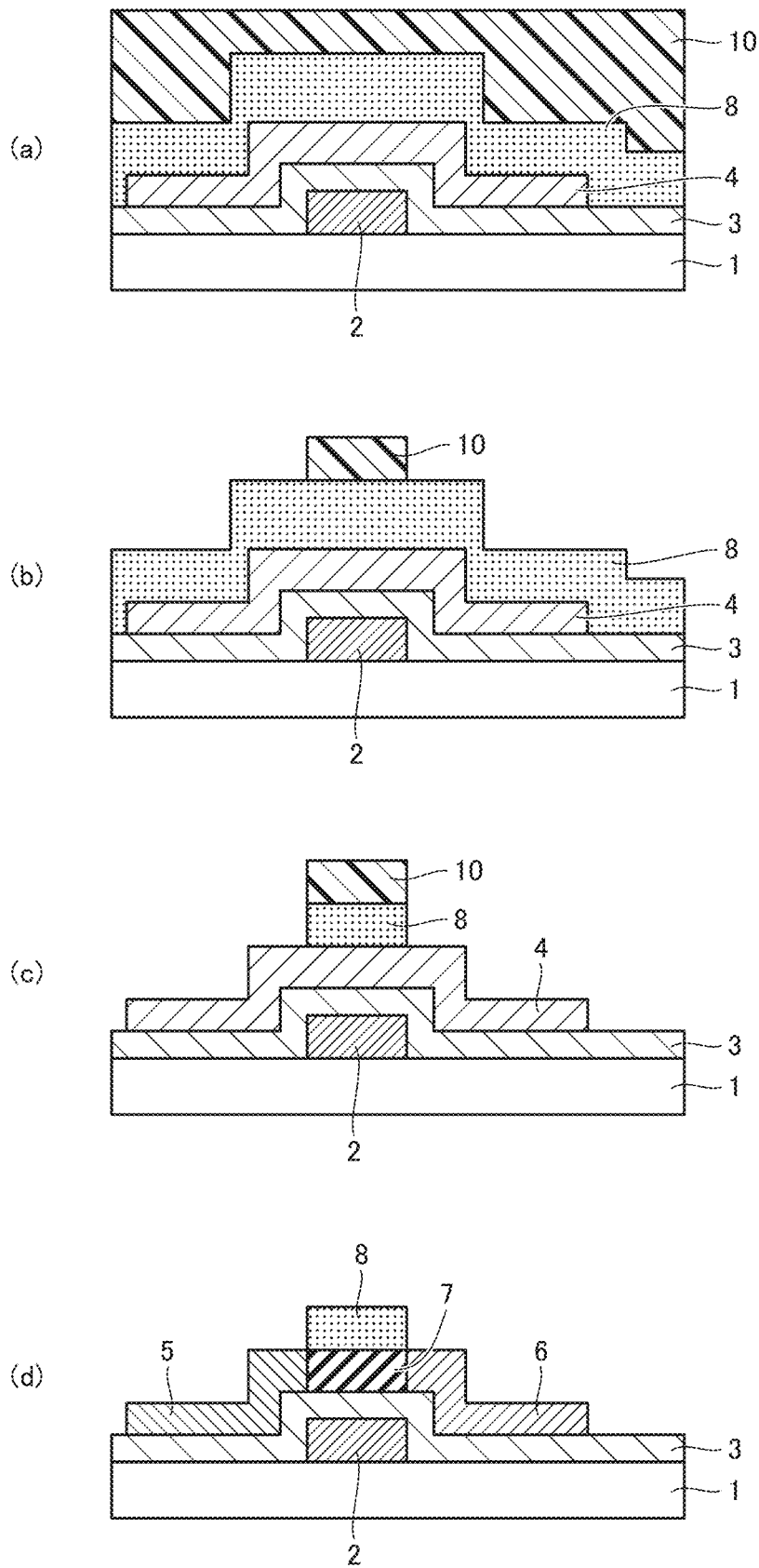
FIG. 4 is a schematic cross-sectional view showing one example of a method for manufacturing the semiconductor device shown in FIG. 2.

FIG. 4 is a schematic cross-sectional view showing one example of the method for manufacturing the bottom gate-type semiconductor device shown in FIG. 2. Taking the bottom gate-type semiconductor device shown in FIG. 2 as an example, the method for manufacturing the bottom gate-type semiconductor device will be described below. The method for manufacturing the bottom gate-type semiconductor device shown in FIG. 2 includes, for example, the following steps in the listed order:

[a] forming gate electrode 2 on substrate 1 [corresponding to the above-described step (1)]; [b] forming first insulating layer (gate insulating layer) 3 on gate electrode 2;

[c] forming an oxide semiconductor layer 4 on first insulating layer 3 [corresponding to the above-described step (2)];

[d] forming second insulating layer (insulating protective layer) 8 on oxide semiconductor layer 4;

[e] patterning second insulating layer 8 and forming the partially covering insulating layer covering a part of the main surface of oxide semiconductor layer 4 [corresponding to the above-described step (3)]; and

[f] performing heat treatment [corresponding to the above-described step (4)].

(Step [a])

This step is the step of forming gate electrode 2 on substrate 1. Although substrate 1 is not particularly limited, a quartz glass substrate, an alkali-free glass substrate, an alkali glass substrate or the like is preferable from the perspective of increasing the transparency, the price stability and the surface smoothness. Although gate electrode 2 is not particularly limited, an Mo electrode, a Ti electrode, a W electrode, an Al electrode, a Cu electrode or the like is preferable from the perspective of high oxidation resistance, low electric resistance, and further the material that can block ultraviolet rays applied to the resist layer used in the subsequent step. Although a method for forming gate electrode 2 is not particularly limited, the vacuum vapor deposition method, the sputtering method or the like is preferable from the perspective of allowing large-area and uniform formation on a main surface of substrate 1. Gate electrode 2 may be directly formed on the main surface of substrate 1, or may be formed on substrate 1 with another layer (such as an insulating layer composed of an organic substance or an inorganic substance) interposed therebetween. Gate electrode 2 is preferably formed to have a uniform film thickness.

Then, application of a resist material, irradiation with ultraviolet rays using a photomask, and development are performed, to thereby form a resist pattern corresponding to a wiring pattern of designed gate electrode 2. Then, a portion of gate electrode 2 that is not covered with the resist layer is etched by an acid solution or plasma treatment, and thereafter, the resist layer is removed. The wiring of gate electrode 2 (patterned gate electrode 2) is thus formed.

(Step [b])

This step is the step of forming first insulating layer (gate insulating layer) 3 on patterned gate electrode 2. Normally, first insulating layer 3 is formed on the entire main surface of a stack having substrate 1 and gate electrode 2, including the main surface of patterned gate electrode 2. Although a method for forming first insulating layer 3 is not particularly limited, the method for forming first insulating layer 3 is preferably a plasma CVD (chemical vapor deposition) method or the like from the perspectives of allowing large-area and uniform formation and of ensuring the insulation property. First insulating layer 3 is preferably formed to have a uniform film thickness.

First insulating layer (gate insulating layer) 3 can be, for example, an $SiO_x$ layer, an $SiO_xN_y$ layer, an $SiN_x$ layer, an $AlO_x$ layer, or an $Al_2O_xN_y$ layer. However, in order to achieve both high field-effect mobility and high reliability under light irradiation of the semiconductor device, first insulating layer (gate insulating layer) 3 is preferably an $SiO_x$ layer.

(Step [c])

This step is the step of forming oxide semiconductor layer 4 on first insulating layer 3. As described above, oxide semiconductor layer 4 is preferably formed by the method including the step of film formation by the sputtering method, and can also be formed by performing heat treatment during film formation by the sputtering method. Oxide semiconductor layer 4 is preferably formed to have a uniform film thickness.

Then, application of a resist material, irradiation with ultraviolet rays using a photomask, and development are performed, to thereby form a resist pattern corresponding to a wiring pattern of designed channel layer 7, source electrode 5 and drain electrode 6. Then, a portion of oxide semiconductor layer 4 that is not covered with the resist layer is etched by an acid solution or plasma treatment, and thereafter, the resist layer is removed. A wiring pattern of oxide semiconductor layer 4 (patterned oxide semiconductor layer 4) is thus formed.

(Step [d])

This step is the step of forming second insulating layer (insulating protective layer) 8 on patterned oxide semiconductor layer 4. Normally, second insulating layer 8 is formed on the entire main surface of a stack having substrate 1, gate electrode 2, first insulating layer 3, and oxide semiconductor layer 4, including the main surface of patterned oxide semiconductor layer 4. Although a method for forming second insulating layer 8 is not particularly limited, the method for forming second insulating layer 8 is preferably the plasma CVD (chemical vapor deposition) method or the like from the perspectives of allowing large-area and uniform formation and of ensuring the insulation property. Second insulating layer 8 is preferably formed to have a uniform film thickness.

Second insulating layer 8 corresponds to the above-described high oxygen insulating layer and is a layer that will form the partially covering insulating layer. Second insulating layer 8 can be, for example, an $SiO_x$ layer (x≥1.5), an $SiO_xN_y$ layer (x≥1.5) or an $AlO_x$ layer (x≥1.5). However, in order to achieve both high field-effect mobility and high reliability under light irradiation of the semiconductor device, second insulating layer 8 is preferably an $SiO_x$ layer (x≥1.5), and more preferably an $SiO_2$ layer. As described above, in order to separately form channel layer 7, source electrode 5 and drain electrode 6 from oxide semiconductor layer 4, an oxygen atom content rate of second insulating layer 8 is preferably higher than that of oxide semiconductor layer 4 and/or the oxygen atom content rate of second insulating layer 8 is preferably higher than that of third insulating layer 9 when third insulating layer 9 is present in the below-described step of performing heat treatment.

(Step [e])

This step is the step of patterning second insulating layer 8 and forming the partially covering insulating layer covering a part of the main surface of oxide semiconductor layer 4. In this step, a resist material is first applied, to thereby form a resist layer 10 on second insulating layer 8. A stack having a structure shown in FIG. 4(a) is thus obtained. Next, ultraviolet rays are applied from the substrate 1 side. At this time, the ultraviolet rays are blocked by gate electrode 2, and thus, a region A that is not exposed by the ultraviolet rays and a region B that is exposed without blockage of the ultraviolet rays are formed in resist layer 10. Next, development is performed, to thereby dissolve resist layer 10 in region B exposed by the ultraviolet rays. A stack having a structure shown in FIG. 4(b) is thus obtained.

Next, a portion of second insulating layer 8 that is not covered with resist layer 10 is etched by an acid solution or plasma treatment until the surface of oxide semiconductor layer 4 is exposed, and thus, second insulating layer 8 is patterned. A stack having a structure shown in FIG. 4(c) is thus obtained. Patterned second insulating layer 8 corresponds to the partially covering insulating layer. In this manner, the partially covering insulating layer is formed by patterning with self alignment using preliminarily fabricated gate electrode 2. Thereafter, resist layer 10 on patterned second insulating layer 8 is removed.

(Step [f])

This step is the step of performing heat treatment. By this heat treatment, a region, which is a part of oxide semiconductor layer 4 and is covered with second insulating layer 8 (partially covering insulating layer), forms channel layer 7, and on the other hand, a region, which is the other part of oxide semiconductor layer 4 and has the exposed main surface without being covered with second insulating layer 8 (partially covering insulating layer), decreases in electric resistivity and thus forms source electrode 5 or drain electrode 6. Source electrode 5 and drain electrode 6 can also be used as pixel electrodes.

When the obtained stack (bottom gate-type TFT) is viewed from above, a length of channel layer 7 that is a part of oxide semiconductor layer 4 is equal to a width of gate electrode 2. More specifically, when the stack is viewed from above, channel layer 7 is arranged in a region directly above gate electrode 2. Therefore, an interface position between channel layer 7 and source electrode 5 as well as an interface position between channel layer 7 and drain electrode 6 are equal to positions of end faces of gate electrode 2. Such positional relationship between channel layer 7 and gate electrode 2 may apply only to the TFT region that is the semiconductor device, and the wiring pattern of the gate electrode other than the TFT region does not necessarily need to be patterned in the oxide semiconductor layer.

A method for the heat treatment is not particularly limited, and can be heating treatment by lamp irradiation, an electric resistive element, a laser beam and the like. A heating temperature is preferably not lower than 100° C. and not higher than 500° C. In order to achieve high field-effect mobility, the heating temperature is more preferably not higher than 450° C., and further preferably not higher than 400° C. In order to achieve high reliability under light irradiation, the heating temperature is more preferably not lower than 150° C., and further preferably not lower than 300° C. From the perspective of achieving both high field-effect mobility and high reliability under light irradiation, the heating temperature is particularly preferably not lower than 300° C. and not higher than 500° C.

The atmosphere of the heat treatment may be various types of atmospheres such as in the air, in the nitrogen gas, in the nitrogen gas-oxygen gas, in the Ar gas, in the Ar-oxygen gas, in the water vapor-containing air, and in the water vapor-containing nitrogen, and is more preferably in the nitrogen gas. The pressure in the atmosphere can be a pressure under reduced pressure conditions (e.g., lower than 0.1 Pa) or a pressure under increased pressure conditions (e.g., 0.1 Pa to 9 MPa), or the atmospheric pressure, and is preferably the atmospheric pressure. The heat treatment time can be, for example, approximately 0.01 seconds to 2 hours, and is preferably approximately 1 second to 10 minutes.

Not only a part of oxide semiconductor layer 4 but also another metal layer that can be formed by the same method as the method for forming gate electrode 2 can be used as a signal wiring.

(Step [g])

As shown in FIG. 2, the step [g] of forming third insulating layer 9 on a surface of the stack may be provided. Normally, third insulating layer 9 is formed on the entire main surface of the stack. Although a method for forming third insulating layer 9 is not particularly limited, the method for forming third insulating layer 9 is preferably the plasma CVD (chemical vapor deposition) method or the like from the perspectives of allowing large-area and uniform formation and of ensuring the insulation property.

The step [g] of forming third insulating layer 9 may be performed before the step [f] of performing heat treatment, or may be performed after the step [f]. When the step [g] is performed before the step [f] of performing heat treatment, third insulating layer 9 may be the above-described low oxygen insulating layer. In this case, third insulating layer 9 can be, for example, an $SiO_xN_y$ layer (x<1.5 and y>0.5), an $SiN_x$ layer or an $Al_2O_xN_y$ layer (x<3 and y>0), and is preferably an $SiN_x$ layer from the perspective of decreasing the electric resistivity of source electrode 5 and drain electrode 6. As described above, in order to separately form channel layer 7, source electrode 5 and drain electrode 6 from oxide semiconductor layer 4, the oxygen atom content rate of third insulating layer 9 is preferably lower than that of oxide semiconductor layer 4 and/or the oxygen atom content rate of third insulating layer 9 is preferably lower than that of second insulating layer 8 from the perspective of decreasing the electric resistivity of source electrode 5 and drain electrode 6.

On the other hand, when the step [g] is performed after the step [f], third insulating layer 9 can be, for example, an $SiO_x$ layer, an $SiO_xN_y$ layer, an $SiN_x$ layer, an $AlO_x$ layer, an $Al_2O_xN_y$ layer or the like, and is preferably an $SiN_x$ layer from the perspective of maintaining the low electric resistivity of source electrode 5 and drain electrode 6.

<Method for Manufacturing Top Gate-Type Semiconductor Device>

Figure 5:
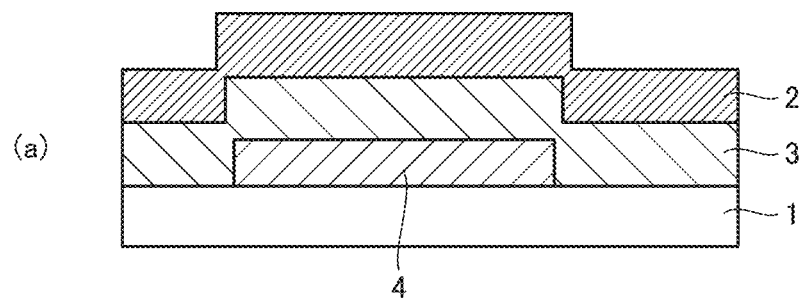
FIG. 5 is a schematic cross-sectional view showing one example of a method for manufacturing the semiconductor device shown in FIG. 3.
Figure 5:
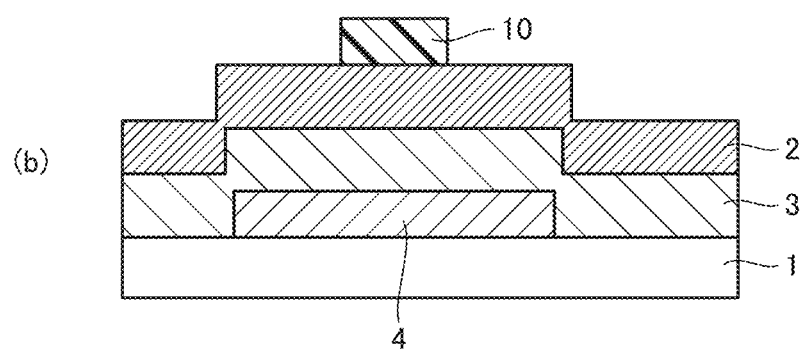
Figure 5:
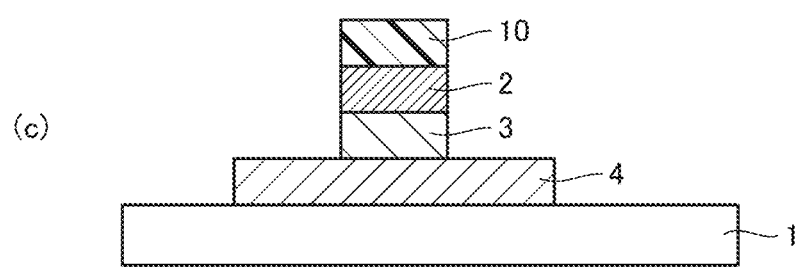
Figure 5:
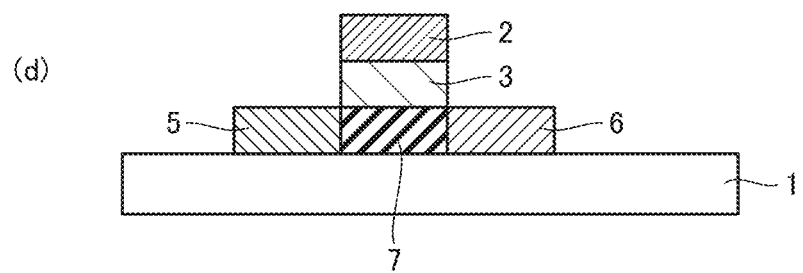

FIG. 5 is a schematic cross-sectional view showing one example of the method for manufacturing the top gate-type semiconductor device shown in FIG. 3. Taking the top gate-type semiconductor device shown in FIG. 3 as an example, the method for manufacturing the top gate-type semiconductor device will be described below. The method for manufacturing the top gate-type semiconductor device shown in FIG. 3 includes, for example, the following steps in the listed order:

[A] forming oxide semiconductor layer 4 on substrate 1 [corresponding to the above-described step (2)];

[B] forming first insulating layer 3 on oxide semiconductor layer 4;

[C] forming gate electrode 2 on first insulating layer 3 [corresponding to the above-described step (1)];

[D] patterning gate electrode 2 and forming the partially covering insulating layer covering a part of the main surface of oxide semiconductor layer 4 using gate electrode 2 [corresponding to the above-described step (3)]; and

[E] performing heat treatment [corresponding to the above-described step (4)].

(Step [A])

This step is the step of forming oxide semiconductor layer 4 on substrate 1. As to the method for forming substrate 1 and the method for forming oxide semiconductor layer 4, the description about the method for manufacturing the bottom gate-type semiconductor device is cited. Oxide semiconductor layer 4 may be directly formed on the main surface of substrate 1, or may be formed on substrate 1 with another layer (such as an insulating layer composed of an organic substance or an inorganic substance) interposed therebetween. Oxide semiconductor layer 4 is preferably formed to have a uniform film thickness. Then, oxide semiconductor layer 4 is patterned. As to this patterning as well, the description about the method for manufacturing the bottom gate-type semiconductor device is cited.

(Step [B])

This step is the step of forming first insulating layer (gate insulating layer) 3 on patterned oxide semiconductor layer 4. Normally, first insulating layer 3 is formed on the entire main surface of a stack having substrate 1 and oxide semiconductor layer 4, including the main surface of patterned oxide semiconductor layer 4. As to the method for forming first insulating layer 3 and the material of first insulating layer 3, the description about the method for manufacturing the bottom gate-type semiconductor device is cited. First insulating layer 3 is preferably formed to have a uniform film thickness.

(Step [C])

This step is the step of forming gate electrode 2 on first insulating layer 3. Normally, gate electrode 2 is formed on the entire main surface of the stack. A stack having a structure shown in FIG. 5(a) is thus obtained. As to the material of gate electrode 2 and the method for forming gate electrode 2, the description about the method for manufacturing the bottom gate-type semiconductor device is cited.

(Step [D])

This step is the step of patterning gate electrode 2 and forming the partially covering insulating layer covering a part of the main surface of oxide semiconductor layer 4 using gate electrode 2. In this step, a resist material is first applied, to thereby form resist layer 10 on gate electrode 2. Then, irradiation with ultraviolet rays using a photomask and development are performed, to thereby form a resist pattern corresponding to a wiring pattern of designed gate electrode 2. A stack having a structure shown in FIG. 5(b) is thus obtained.

Next, a portion of gate electrode 2 that is not covered with resist layer 10 is etched by an acid solution or plasma treatment, and thus, gate electrode 2 is patterned. First insulating layer 3 is exposed in the etched portion of gate electrode 2. Then, using patterned gate electrode 2, the exposed portion of first insulating layer 3 is etched by an acid solution or plasma treatment until oxide semiconductor layer 4 is exposed, and thus, first insulating layer 3 is patterned. A stack having a structure shown in FIG. 5(c) is thus obtained. Patterned first insulating layer 3 corresponds to the partially covering insulating layer. In this manner, the partially covering insulating layer is formed by patterning with self alignment using preliminarily fabricated gate electrode 2. Thereafter, resist layer 10 on patterned gate electrode 2 is removed.

(Step [E])

This step is the step of performing heat treatment. By this heat treatment, a region, which is a part of oxide semiconductor layer 4 and is covered with first insulating layer 3 (partially covering insulating layer), forms channel layer 7, and on the other hand, a region, which is the other part of oxide semiconductor layer 4 and has the exposed main surface without being covered with first insulating layer 3 (partially covering insulating layer), decreases in electric resistivity and thus forms source electrode 5 or drain electrode 6. Source electrode 5 and drain electrode 6 can also be used as pixel electrodes. As to the method for heat treatment, the description about the method for manufacturing the bottom gate-type semiconductor device is cited.

When the obtained stack (top gate-type TFT) is viewed from above, a length of channel layer 7 that is a part of oxide semiconductor layer 4 is equal to a width of gate electrode 2. More specifically, when the stack is viewed from above, channel layer 7 is arranged in a region directly below gate electrode 2. Therefore, an interface position between channel layer 7 and source electrode 5 as well as an interface position between channel layer 7 and drain electrode 6 are equal to positions of end faces of gate electrode 2.

Not only a part of oxide semiconductor layer 4 but also another metal layer that can be formed by the same method as the method for forming gate electrode 2 can be used as a signal wiring.

(Step [F])

As shown in FIG. 3, the step [F] of forming third insulating layer 9 on a surface of the stack may be provided. Normally, third insulating layer 9 is formed on the entire main surface of the stack. As to the method for forming third insulating layer 9, the description about the method for manufacturing the bottom gate-type semiconductor device is cited.

The step [F] of forming third insulating layer 9 may be performed before the step [E] of performing heat treatment, or may be performed after the step [E]. When the step [F] is performed before the step [E] of performing heat treatment, third insulating layer 9 may be the above-described low oxygen insulating layer. In this case, third insulating layer 9 can be, for example, an $SiO_xN_y$ layer (x<1.5 and y>0.5), an $SiN_x$ layer or an $Al_2O_xN_y$ layer (x<3 and y>0), and is preferably an $SiN_x$ layer from the perspective of decreasing the electric resistivity of source electrode 5 and drain electrode 6. As described above, in order to separately form channel layer 7, source electrode 5 and drain electrode 6 from oxide semiconductor layer 4, the oxygen atom content rate of third insulating layer 9 is preferably lower than that of oxide semiconductor layer 4 and/or the oxygen atom content rate of third insulating layer 9 is preferably lower than that of first insulating layer 3 from the perspective of decreasing the electric resistivity of source electrode 5 and drain electrode 6.

On the other hand, when the step [F] is performed after the step [E], third insulating layer 9 can be, for example, an $SiO_x$ layer, an $SiO_xN_y$ layer, an $SiN_x$ layer, an $AlO_x$ layer, an $Al_2O_xN_y$ layer or the like, and is preferably an $SiN_x$ layer from the perspective of maintaining the low electric resistivity of source electrode 5 and drain electrode 6.

EXAMPLES

Examples 1 to 18: Fabrication of Bottom Gate-Type TFT

A TFT having a configuration similar to that of the bottom gate-type TFT shown in FIG. 2 was fabricated in accordance with the following procedure. First, an alkali-free glass substrate of 50 mm in height×50 mm in width×0.6 mm in depth was prepared as substrate 1, and an Mo electrode of 100 nm in thickness was formed as gate electrode 2 on substrate 1 by the sputtering method.

Next, a positive-type resist material was applied onto a surface of gate electrode 2 to thereby form a resist layer, and prebaking was performed under the conditions of 90° C. and 60 seconds. Then, substrate 1 having the resist layer was irradiated with ultraviolet rays (wavelength: 310 to 440 nm) through a photomask having a metal film corresponding to a prescribed wiring pattern of gate electrode 2. Then, substrate 1 having the resist layer was immersed in a developer. At the time of development, there remained the resist layer in a region where the ultraviolet rays were blocked by the metal film of the photomask and were not applied. On the other hand, the resist layer corresponding to a portion that did not have the metal film of the photomask was exposed by the ultraviolet rays having passed through the glass of the photomask, and was dissolved in the developer at the time of development. After development, substrate 1 was washed with water.

Next, substrate 1 was immersed in a PAN [acetic acid: nitric acid aqueous solution (61 weight %):phosphoric acid aqueous solution (85 weight %):water=4:4:16:1 (volume ratio)] aqueous solution maintained at 30° C. in a water bath, and the portion of gate electrode 2 having the exposed surface as a result of development was etched until substrate 1 was exposed, and thus, gate electrode 2 was patterned. After etching, substrate 1 was washed with water, and the resist layer on gate electrode 2 was stripped off and removed with a resist stripping solution.

Next, an $SiO_x$ layer of 200 nm in thickness, which was an amorphous oxide layer, was formed as first insulating layer (gate insulating layer) 3 on a surface of substrate 1 and on patterned gate electrode 2 by the plasma CVD method. A mixed gas of $SiH_4$ and $N_2O$ was used as a raw material gas.

Next, oxide semiconductor layer 4 was formed on first insulating layer (gate insulating layer) 3 by a DC (direct current) magnetron sputtering method. A plane of a target having a diameter of 3 inches (76.2 mm) was a sputtering surface. An oxide sintered body including In, W and Zn and mainly composed of $In_2O_3$ crystals and having at least one or more of ZnO crystals, $ZnWO_4$ crystals, $In_2O_3(ZnO)_m$ (m is a natural number) crystals, and $In_6WO_{12}$ crystals mixedly present therein was used as the target. When oxide semiconductor layer 4 contained zirconium (Zr), $ZrO_2$ was added during preparation of the above-described oxide sintered body, to thereby prepare an oxide sintered body. A film thickness of formed oxide semiconductor layer 4 is shown in Table 1. The film thickness of oxide semiconductor layer 4 was calculated by observing a layer cross section with the transmission electron microscope, measuring a distance from a lowermost surface to an uppermost surface of the layer, and dividing the distance by an observation magnification. Measurement of the distance was performed at five points and the film thickness was calculated from an average value thereof.

Formation of oxide semiconductor layer 4 will be described more specifically. Substrate 1 having gate electrode 2 and first insulating layer (gate insulating layer) 3 formed thereon was arranged on a water-cooled substrate holder in a film formation chamber of a sputtering apparatus such that first insulating layer 3 was exposed. The aforementioned target was arranged at a distance of 60 mm to face first insulating layer 3. The degree of vacuum in the film formation chamber was set at approximately $6 \times 10^{-5}$ Pa and the target was sputtered as follows.

First, with a shutter interposed between first insulating layer 3 and the target, a mixed gas of an Ar (argon) gas and an $O_2$ (oxygen) gas was introduced into the film formation chamber until the pressure of 0.5 Pa was reached. A content rate of the $O_2$ gas in the mixed gas was 10 volume %. The DC electric power of 120 W was applied to the target to cause sputtering discharge, and thereby, cleaning (pre-sputtering) of the target surface was performed for 5 minutes.

Next, the DC electric power of 120 W was applied to the same target, and with the atmosphere in the film formation chamber maintained, the aforementioned shutter was removed and oxide semiconductor layer 4 was formed on first insulating layer 3. A bias voltage was not particularly applied to the substrate holder. The substrate holder was water-cooled or heated and the temperature of substrate 1 during film formation and after film formation was adjusted. Of Examples and Comparative Examples, in the case where "performed" is described in the section of "Heating Treatment During Film Formation" in Table 1 to Table 3, the substrate holder was heated and the substrate temperature was adjusted to the temperature described in the section of "Treatment Temperature" in Table 1 to Table 3 during film formation, and thereby, the heating treatment was performed simultaneously with film formation. The heating time was a total of 30 minutes from before formation of oxide semiconductor layer 4 to after the end of formation. In addition, in the case where "not performed" is described in the section of "Heating Treatment" in Table 1 to Table 3, the heating treatment was not performed during film formation. In this case, the substrate temperature during film formation was approximately 20° C. In any of Examples and Comparative Examples, the film formation time was adjusted such that the film thickness of oxide semiconductor layer 4 had values shown in Table 1 to Table 3.

As described above, oxide semiconductor layer 4 was formed by the DC (direct current) magnetron sputtering method by using the oxide sintered body target.

Next, a positive-type resist material was applied onto oxide semiconductor layer 4 to thereby form a resist layer, and prebaking was performed under the conditions of 90° C. and 60 seconds. Then, substrate 1 having the resist layer was irradiated with ultraviolet rays (wavelength: 310 to 440 nm)

through a photomask having a metal film corresponding to a prescribed wiring pattern of oxide semiconductor layer 4. Then, substrate 1 having the resist layer was immersed in a developer. At the time of development, there remained the resist layer in a region where the ultraviolet rays were blocked by the metal film of the photomask and were not applied. On the other hand, the resist layer corresponding to a portion that did not have the metal film of the photomask was exposed by the ultraviolet rays having passed through the glass of the photomask, and was dissolved in the developer at the time of development. After development, substrate 1 was washed with water.

Next, substrate 1 was immersed in a "ITO-07A" solution (manufactured by Kanto Chemical Co., Inc.) maintained at 30° C. in a water bath, and the portion of oxide semiconductor layer 4 having the exposed surface as a result of development was etched until underlying first insulating layer (gate insulating layer) 3 was exposed, and thus, oxide semiconductor layer 4 was patterned. After etching, substrate 1 was washed with water, and the resist layer on oxide semiconductor layer 4 was stripped off and removed with a resist stripping solution.

Next, an $SiO_x$ layer of 200 nm in thickness, which was an amorphous oxide layer, was formed as second insulating layer (insulating protective layer) 8 (a layer that will form the partially covering insulating layer) on the entire exposed surface of patterned oxide semiconductor layer 4 by the plasma CVD method. Namely, in the region where first insulating layer (gate insulating layer) 3 was exposed as a result of etching described above, first insulating layer (gate insulating layer) 3 and second insulating layer 8 were in contact with each other. A mixed gas of $SiH_4$ and $N_2O$ was used as a raw material gas.

Next, a positive-type resist material was applied onto second insulating layer 8 to thereby form resist layer 10, and prebaking was performed under the conditions of 90° C. and 60 seconds. A stack having a structure similar to the structure shown in FIG. 4(a) was thus obtained. Then, with a substrate 1 surface of the stack being the upper surface and a resist layer 10 surface being the lower surface, ultraviolet rays (wavelength: 310 to 440 nm) was applied from the upper surface. Then, substrate 1 having resist layer 10 was immersed in a developer. In the stack, only gate electrode 2 blocked the ultraviolet rays. Therefore, at the time of development, there remained resist layer 10 in a region where the ultraviolet rays were blocked by gate electrode 2 and were not applied. On the other hand, resist layer 10 corresponding to a portion that did not have gate electrode 2 was exposed and dissolved in the developer at the time of development. After development, substrate 1 was washed with water. A stack having a structure similar to the structure shown in FIG. 4(b) was thus obtained.

Then, substrate 1 was immersed in a buffered hydrofluoric acid aqueous solution maintained at 30° C. in a water bath, and the portion of second insulating layer 8 having the exposed surface as a result of development was etched until oxide semiconductor layer 4 and first insulating layer (gate insulating layer) 3 were exposed, and thus, second insulating layer 8 was patterned. A stack having a structure similar to the structure shown in FIG. 4(c) was thus obtained. After etching, substrate 1 was washed with water, and the resist layer on gate electrode 2 was stripped off and removed with a resist stripping solution. At this stage, when the substrate 1 surface was the lower surface, the stack had second insulating layer 8 (partially covering insulating layer) covering a part of the upper surface (main surface) of oxide semiconductor layer 4. The upper surface (main surface) of oxide semiconductor layer 4 that was not covered with second insulating layer 8 was exposed.

Next, heat treatment was performed in the atmospheric pressure nitrogen atmosphere under the conditions of 250° C. and 10 minutes or 350° C. and 10 minutes. A stack (bottom gate-type TFT) having a structure similar to the structure shown in FIG. 4(d) was thus obtained. By this heat treatment, a region, which was a part of oxide semiconductor layer 4 and was covered with second insulating layer 8 (partially covering insulating layer), formed channel layer 7, and on the other hand, a region, which was the other part of oxide semiconductor layer 4 and had the exposed main surface without being covered with second insulating layer 8 (partially covering insulating layer), decreased in electric resistivity and thus could be used as source electrode 5 or drain electrode 6. When the obtained stack was viewed from above, a length of channel layer 7 that was a part of oxide semiconductor layer 4 was equal to a width of gate electrode 2. More specifically, when the stack was viewed from above, channel layer 7 was arranged in a region directly above gate electrode 2. Therefore, an interface position between channel layer 7 and source electrode 5 as well as an interface position between channel layer 7 and drain electrode 6 were equal to positions of end faces of gate electrode 2. First insulating layer (gate insulating layer) 3 was interposed between gate electrode 2 and oxide semiconductor layer 4.

Finally, an $SiN_x$ layer of 200 nm in thickness, which was amorphous nitride, was formed as third insulating layer (insulating protective layer) 9 on the entire exposed surface of the stack (including the exposed surface of oxide semiconductor layer 4, the exposed surface of first insulating layer (gate insulating layer) 3, and the exposed surface of second insulating layer 8) by the plasma CVD method. The bottom gate-type TFT having a configuration similar to that of FIG. 2 was thus obtained. In the region where first insulating layer (gate insulating layer) 3 was exposed as a result of etching described above, first insulating layer (gate insulating layer) 3 and third insulating layer 9 were in contact with each other. A mixed gas of $SiH_4$ and $NH_3$ was used as a raw material gas.

In Example 1, third insulating layer 9 was formed after heat treatment. However, there were also examples in which third insulating layer 9 was formed before heat treatment. Of Examples and Comparative Examples, in the case where "before" is described in the section of "Third Insulating Layer 9" in Table 1 to Table 3, third insulating layer 9 was formed before heat treatment. In the case where "after" is described, third insulating layer 9 was formed after heat treatment. In the case where "none" is described, third insulating layer 9 was not formed. When third insulating layer 9 is formed before heat treatment, third insulating layer 9 may be a low oxygen insulating layer.

As to the oxide semiconductor forming channel layer 7 as well as source electrode 5 and drain electrode 6 possessed by the TFT in each of Examples 1 to 18, the bonding energy of tungsten contained in the oxide semiconductor was measured using X-ray photoelectron spectroscopy (XPS). Then, it was confirmed that a peak position was not less than 35 eV and not more than 36.5 eV. As a result, it was confirmed that the above-described oxide semiconductor contained hexavalent tungsten.

Examples 19 to 36: Fabrication of Top Gate-Type TFT

A TFT having a configuration similar to that of the top gate-type TFT shown in FIG. 3 was fabricated in accordance with the following procedure. First, an alkali-free glass substrate of 50 mm in height×50 mm in width×0.6 mm in depth was prepared as substrate 1, and oxide semiconductor layer 4 was formed on substrate 1 by the DC (direct current) magnetron sputtering method. A plane of a target having a diameter of 3 inches (76.2 mm) was a sputtering surface. An oxide sintered body including In, W and Zn and mainly composed of $In_2O_3$ crystals and having at least one or more of ZnO crystals, $ZnWO_4$ crystals, $In_2O_3(ZnO)_m$ (m is a natural number) crystals, and $In_6WO_{12}$ crystals mixedly present therein was used as the target. When oxide semiconductor layer 4 contained zirconium (Zr), $ZrO_2$ was added during preparation of the above-described oxide sintered body, to thereby prepare an oxide sintered body. A film thickness of formed oxide semiconductor layer 4 is shown in Table 2 (the measurement method is as described above).

Formation of oxide semiconductor layer 4 will be described more specifically. Substrate 1 was arranged on a water-cooled substrate holder in a film formation chamber of a sputtering apparatus. The aforementioned target was arranged at a distance of 60 mm to face substrate 1. The degree of vacuum in the film formation chamber was set at approximately $6×10^{-5}$ Pa and the target was sputtered as follows.

First, with a shutter interposed between substrate 1 and the target, a mixed gas of an Ar (argon) gas and an $O_2$ (oxygen) gas was introduced into the film formation chamber until the pressure of 0.5 Pa was reached. A content rate of the $O_2$ gas in the mixed gas was 10 volume %. The DC electric power of 120 W was applied to the target to cause sputtering discharge, and thereby, cleaning (pre-sputtering) of the target surface was performed for 5 minutes.

Next, the DC electric power of 120 W was applied to the same target, and with the atmosphere in the film formation chamber maintained, the aforementioned shutter was removed and oxide semiconductor layer 4 was formed on substrate 1. A bias voltage was not particularly applied to the substrate holder. The substrate holder was water-cooled or heated and the temperature of substrate 1 during film formation and after film formation was adjusted.

As described above, oxide semiconductor layer 4 was formed by the DC (direct current) magnetron sputtering method by using the oxide sintered body target.

Next, a positive-type resist material was applied onto oxide semiconductor layer 4 to thereby form a resist layer, and prebaking was performed under the conditions of 90° C. and 60 seconds. Then, substrate 1 having the resist layer was irradiated with ultraviolet rays (wavelength: 310 to 440 nm) through a photomask having a metal film corresponding to a prescribed wiring pattern of oxide semiconductor layer 4. Then, substrate 1 having the resist layer was immersed in a developer. At the time of development, there remained the resist layer in a region where the ultraviolet rays were blocked by the metal film of the photomask and were not applied. On the other hand, the resist layer corresponding to a portion that did not have the metal film of the photomask was exposed by the ultraviolet rays having passed through the glass of the photomask, and was dissolved in the developer at the time of development. After development, substrate 1 was washed with water.

Next, substrate 1 was immersed in a "ITO-07A" solution (manufactured by Kanto Chemical Co., Inc.) maintained at 30° C. in a water bath, and the portion of oxide semiconductor layer 4 having the exposed surface as a result of development was etched until underlying substrate 1 was exposed, and thus, oxide semiconductor layer 4 was patterned. After etching, substrate 1 was washed with water, and the resist layer on oxide semiconductor layer 4 was stripped off and removed with a resist stripping solution.

Next, an $SiO_x$ layer of 200 nm in thickness, which was an amorphous oxide layer, was formed as first insulating layer (gate insulating layer) 3 on the surface of substrate 1 and on patterned oxide semiconductor layer 4 by the plasma CVD method. A mixed gas of $SiH_4$ and $N_2O$ was used as a raw material gas.

Next, an Mo electrode of 100 nm in thickness was formed as gate electrode 2 on first insulating layer (gate insulating layer) 3 by the sputtering method. A stack having a structure similar to the structure shown in FIG. 5(a) was thus obtained.

Next, a positive-type resist material was applied onto a surface of gate electrode 2 to thereby form resist layer 10, and prebaking was performed under the conditions of 90° C. and 60 seconds. Then, substrate 1 having resist layer 10 was irradiated with ultraviolet rays (wavelength: 310 to 440 nm) through a photomask having a metal film corresponding to a prescribed wiring pattern of gate electrode 2. Then, substrate 1 having resist layer 10 was immersed in a developer. At the time of development, there remained resist layer 10 in a region where the ultraviolet rays were blocked by the metal film of the photomask and were not applied. On the other hand, resist layer 10 corresponding to a portion that did not have the metal film of the photomask was exposed by the ultraviolet rays having passed through the glass of the photomask, and was dissolved in the developer at the time of development. After development, substrate 1 was washed with water. A stack having a structure similar to the structure shown in FIG. 5(b) was thus obtained.

Next, substrate 1 was immersed in a PAN [acetic acid:nitric acid aqueous solution (61 weight %):phosphoric acid aqueous solution (85 weight %):water=4:4:16:1 (volume ratio)] aqueous solution maintained at 30° C. in a water bath, and the portion of gate electrode 2 having the exposed surface as a result of development was etched until first insulating layer (gate insulating layer) 3 was exposed, and thus, gate electrode 2 was patterned. After etching, substrate 1 was washed with water.

Next, substrate 1 was immersed in a buffered hydrofluoric acid aqueous solution maintained at 30° C. in a water bath, and using patterned gate electrode 2, the portion of first insulating layer (gate insulating layer) 3 having the exposed surface as a result of etching described above was etched until oxide semiconductor layer 4 and substrate 1 were exposed, and thus, first insulating layer 3 was patterned. A stack having a structure similar to the structure shown in FIG. 5(c) was thus obtained. After etching, substrate 1 was washed with water, and resist layer 10 on gate electrode 2 was stripped off and removed with a resist stripping solution. At this stage, when the substrate 1 surface was the lower surface, the stack had first insulating layer (gate insulating layer) 3 (partially covering insulating layer) covering a part of the upper surface (main surface) of oxide semiconductor layer 4. The upper surface (main surface) of oxide semiconductor layer 4 that was not covered with first insulating layer (gate insulating layer) 3 was exposed.

Next, heat treatment was performed in the atmospheric pressure nitrogen atmosphere under the conditions of 250° C. and 1 second or 350° C. and 1 second. A stack (top gate-type TFT) having a structure similar to the structure shown in FIG. 5(d) was thus obtained. By this heat treatment, a region, which was a part of oxide semiconductor layer 4 and was covered with first insulating layer (gate insulating layer) 3, formed channel layer 7, and on the other hand, a region, which was the other part of oxide semiconductor layer 4 and had the exposed main surface without being covered with first insulating layer (gate insulating layer) 3, decreased in electric resistivity and thus could be used as source electrode 5 or drain electrode 6. When the obtained stack was viewed from above, a length of channel layer 7 that was a part of oxide semiconductor layer 4 was equal to a width of gate electrode 2. More specifically, when the stack was viewed from above, channel layer 7 was arranged in a region directly below gate electrode 2. Therefore, an interface position between channel layer 7 and source electrode 5 as well as an interface position between channel layer 7 and drain electrode 6 were equal to positions of end faces of gate electrode 2. First insulating layer (gate insulating layer) 3 was interposed between gate electrode 2 and oxide semiconductor layer 4.

Finally, an $SiN_x$ layer of 200 nm in thickness, which was amorphous nitride, was formed as third insulating layer (insulating protective layer) 9 on the entire exposed surface of the stack (including the exposed surface of oxide semiconductor layer 4, the exposed surface of gate electrode 2, and the exposed surface of substrate 1) by the plasma CVD method. The top gate-type TFT having a configuration similar to that of FIG. 3 was thus obtained. In the region where substrate 1 was exposed as a result of etching described above, substrate 1 and third insulating layer 9 were in contact with each other. A mixed gas of $SiH_4$ and $NH_3$ was used as a raw material gas.

In Example 19, third insulating layer 9 was formed after heat treatment. However, as described above, there were also examples in which third insulating layer 9 was formed before heat treatment. When third insulating layer 9 is formed before heat treatment, third insulating layer 9 may be a low oxygen insulating layer.

As to the oxide semiconductor forming channel layer 7 as well as source electrode 5 and drain electrode 6 possessed by the TFT in each of Examples 19 to 36, the bonding energy of tungsten contained in the oxide semiconductor was measured using X-ray photoelectron spectroscopy (XPS). Then, it was confirmed that a peak position was not less than 35 eV and not more than 36.5 eV. As a result, it was confirmed that the above-described oxide semiconductor contained hexavalent tungsten.

Comparative Example 1

A top gate-type TFT was fabricated similarly to Examples 19 to 36, except that an oxide sintered body having an atomic number ratio of In:Ga:Zn=1:1:1 was used as a target for forming oxide semiconductor layer 4. Even when heat treatment was performed in the atmospheric pressure nitrogen atmosphere under the conditions of 350° C. and 10 minutes, the electric resistivity of source electrode 5 and drain electrode 6 did not decrease and this top gate-type TFT could not be driven as a TFT.

Comparative Example 2

A top gate-type TFT was fabricated similarly to Examples 19 to 36, except that the manufacturing conditions shown in Table 3 were employed. An oxide sintered body [In:W:Zn=1:0.0:0.30 (atomic number ratio)] mainly composed of $In_2O_3$ crystals and having ZnO crystals and $ZrO_2$ crystals mixedly present therein was used as a target for forming oxide semiconductor layer 4.

Comparative Example 3

A top gate-type TFT was fabricated similarly to Examples 19 to 36, except that the manufacturing conditions shown in Table 3 were employed. An oxide sintered body [In:W:Zn=1:0.05:0.00 (atomic number ratio)] mainly composed of $In_2O_3$ crystals and having $WO_3$ crystals and $ZrO_2$ crystals mixedly present therein was used as a target for forming oxide semiconductor layer 4. The same measurement as the above-described measurement was performed and it was confirmed that an oxide semiconductor forming oxide semiconductor layer 4 contained hexavalent tungsten.

Comparative Example 4

A top gate-type TFT was fabricated similarly to Examples 19 to 36, except that the manufacturing conditions shown in Table 3 were employed. An oxide sintered body (Zr content: $6\times10^{18}$ $atms/cm^3$) mainly composed of $In_2O_3$ crystals and having $ZrO_2$ crystals mixedly present therein was used as a target for forming oxide semiconductor layer 4.

Comparative Example 5

A top gate-type TFT was fabricated similarly to Examples 19 to 36, except that the manufacturing conditions shown in Table 3 were employed. An oxide sintered body [In:W:Zn=1:0.000005:0.20 (atomic number ratio)] mainly composed of $In_2O_3$ crystals and having $ZnWO_4$ crystals, ZnO crystals and $ZrO_2$ crystals mixedly present therein was used as a target for forming oxide semiconductor layer 4. The same measurement as the above-described measurement was performed and it was confirmed that an oxide semiconductor forming oxide semiconductor layer 4 contained hexavalent tungsten.

Comparative Example 6

A top gate-type TFT was fabricated similarly to Examples 19 to 36, except that the manufacturing conditions shown in Table 3 were employed. An oxide sintered body [In:W:Zn=1:0.000005:0.30 (atomic number ratio)] mainly composed of $In_2O_3$ crystals and having $ZnWO_4$ crystals, ZnO crystals and $ZrO_2$ crystals mixedly present therein was used as a target for forming oxide semiconductor layer 4. The same measurement as the above-described measurement was performed and it was confirmed that an oxide semiconductor forming oxide semiconductor layer 4 contained hexavalent tungsten.

Comparative Example 7

A top gate-type TFT was fabricated similarly to Examples 19 to 36, except that the manufacturing conditions shown in Table 3 were employed. An oxide sintered body [In:W:Zn=1:0.1:0.20 (atomic number ratio)] mainly composed of $In_2O_3$ crystals and having $ZnWO_4$ crystals, ZnO crystals and $ZrO_2$ crystals mixedly present therein was used as a target for forming oxide semiconductor layer 4. The same measurement as the above-described measurement was performed and it was confirmed that an oxide semiconductor forming oxide semiconductor layer 4 contained hexavalent tungsten.

Comparative Example 8

A top gate-type TFT was fabricated similarly to Examples 19 to 36, except that the manufacturing conditions shown in Table 3 were employed. An oxide sintered body [In:W:Zn=1:0.008:0.48 (atomic number ratio)] mainly composed of $In_2O_3$ crystals and having $ZnWO_4$ crystals, ZnO crystals and $ZrO_2$ crystals mixedly present therein was used as a target for forming oxide semiconductor layer 4. The same measurement as the above-described measurement was performed and it was confirmed that an oxide semiconductor forming oxide semiconductor layer 4 contained hexavalent tungsten.

Comparative Example 9

A top gate-type TFT was fabricated similarly to Examples 19 to 36, except that the manufacturing conditions shown in Table 2 were employed. An oxide sintered body [In:W:Zn=1:0.008:0.012 (atomic number ratio)] mainly composed of $In_2O_3$ crystals and having $ZnWO_4$ crystals, ZnO crystals and $ZrO_2$ crystals mixedly present therein was used as a target for forming oxide semiconductor layer 4. The same measurement as the above-described measurement was performed and it was confirmed that an oxide semiconductor forming oxide semiconductor layer 4 contained hexavalent tungsten.

[Measurement and Evaluation]

(1) Crystallinity, W Content Rate, Zn Content Rate, Zn/W Ratio, and Zr Content of Oxide Semiconductor Layer Forming Channel Layer, Source Electrode and Drain Electrode The crystallinity of oxide semiconductor layer 4 (i.e., channel layer 7, source electrode 5 and drain electrode 6) of the fabricated TFT was evaluated in accordance with the above-described measurement method and definition. The result is shown in Table 1 to Table 3. In Table 1 to Table 3, "N" means that oxide semiconductor layer 4 (i.e., channel layer 7, source electrode 5 and drain electrode 6) is composed of nanocrystalline oxide, and "A" means that oxide semiconductor layer 4 (i.e., channel layer 7, source electrode 5 and drain electrode 6) is composed of amorphous oxide.

The contents of In, W and Zn in oxide semiconductor layer 4 (i.e., channel layer 7, source electrode 5 and drain electrode 6) were measured by the RBS (Rutherford backscattering analysis). Based on these contents, the W content rate (atomic %, denoted as "W Content Rate" in Table 1 to Table 3), the Zn content rate (atomic %, denoted as "Zn Content Rate" in Table 1 to Table 3) and the Zn/W ratio (ratio of atomic number, denoted as "Zn/W Ratio" in Table 1 to Table 3) in oxide semiconductor layer 4 were obtained. The result is shown in Table 1 to Table 3. When the W content rate was not higher than 0.5 atomic %, the number of atoms of W per 1 $cm^3$ was measured by the SIMS and the W content rate was calculated in accordance with the following equation:

W content rate=the number of atoms of W per 1 $cm^3$ by SIMS/($3\times10^{22}$)×100%.

In addition, in accordance with the above-described measurement method, the content of Zr ($atms/cm^3$, denoted as "Zr Content" in Table 1 to Table 3) in oxide semiconductor layer 4 was measured using secondary ion mass spectrometry (SIMS). The result is shown in Table 1 to Table 3.

Oxide semiconductor layer 4 (first oxide semiconductor) forming channel layer 7 was the same as oxide semiconductor layer 4 (second oxide semiconductor) forming source electrode 5 and drain electrode 6 in terms of the In content rate, the W content rate, the Zn content rate, the Zn/W ratio, and the Zr content.

(2) Measurement of Electric Resistivity of Channel Layer, Source Electrode and Drain Electrode The electric resistivity of channel layer 7 was obtained by the following method. A measurement needle was brought into contact with source electrode 5 and drain electrode 6. Next, a source-drain current $I_{ds}$ was measured while changing a voltage from 1 V to 20 V and applying the voltage to between source electrode 5 and drain electrode 6. A slope when drawing a $I_{ds}$–$V_{ds}$ graph referred to a resistance R. From this resistance R as well as channel length $C_L$ (30 μm), channel width $C_W$ (40 μm) and film thickness t, the electric resistivity of channel layer 7 could be determined as $R \times C_W \times t/C_L$. In all of Examples and Comparative Examples, the electric resistivity of channel layer 7 was not lower than $10^{-1}$ Ωcm.

The electric resistivity of source electrode 5 and drain electrode 6 was obtained by the following method. Oxide semiconductor layer 4 having a size of a length $M_L$ (150 μm) and a width $M_W$ (30 μm) was fabricated by the same method as that for source electrode 5 and drain electrode 6 in the previously-described method for fabricating the TFT. Two measurement needles were brought into contact with two sites that were central positions in the width direction of obtained oxide semiconductor layer 4 and were ends in the length direction thereof. Next, I flowing between the two measurement needles was measured while changing a voltage $V_t$ from 1 V to 20 V and applying voltage $V_t$ to the measurement needles. A slope when drawing a I–$V_t$ graph referred to resistance R. From this resistance R as well as length $M_L$ (150 μm), width $M_W$ (30 μm) and film thickness t, the electric resistivity of source electrode 5 and drain electrode 6 could be determined as $R \times M_W \times t/M_L$. The measurement result is shown in Table 1 to Table 3. The electric resistivity of source electrode 5 and drain electrode 6 is denoted as "S/D Electric Resistivity" in Table 1 to Table 3.

(3) Evaluation of Characteristics of TFT

The characteristics of the fabricated TFT were evaluated as follows. First, a measurement needle was brought into contact with gate electrode 2, source electrode 5 and drain electrode 6. A source-drain voltage $V_{ds}$ of 0.2 V was applied to between source electrode 5 and drain electrode 6, and a source-gate voltage $V_{gs}$ applied to between source electrode 5 and gate electrode 2 was changed from −30 V to 20 V and source-drain current $I_{ds}$ at this time was measured. Then, a relationship between source-gate voltage $V_{gs}$ and a square root $[(I_{ds})^{1/2}]$ of source-drain current $I_{ds}$ was graphed (hereinafter, this graph will be also referred to as "$V_{gs}$–$(I_{ds})^{1/2}$ curve"). A tangent line was drawn on the $V_{gs}$–$(I_{ds})^{1/2}$ curve, and defined as threshold voltage $V_{th}$ was an intersection point (x intercept) where the tangent line tangent to a point having the maximum slope of the tangent line intersects with the x axis ($V_{gs}$). Threshold voltage $V_{th}$ was measured for the TFT when the above-described heat treatment was performed at 250° C. in the nitrogen atmosphere and the TFT when the above-described heat treatment was performed at 350° C. in the nitrogen atmosphere. The result is shown in Table 1 to Table 3.

In addition, $g_m$ was derived by differentiating source-drain current $I_{ds}$ with respect to source-gate voltage $V_{gs}$ in accordance with the following equation [a]:

$$g_m = dI_{ds}/dV_{gs} \qquad [a].$$

Then, by using a value of $g_m$ when $V_{gs}$=15.0 V, a field-effect mobility $\mu_{fe}$ was calculated based on the following equation [b]:

$$\mu_{fe} = g_m \times C_L/(C_W \times C_i \times V_{ds}) \qquad [b].$$

In the aforementioned equation [b], channel length $C_L$ was 30 μm and channel width $C_W$ was 40 μm. In addition, capacitance $C_i$ of first insulating layer (gate insulating layer) 3 was $3.4\times10^{-8}$ $F/cm^2$, and source-drain voltage $V_{ds}$ was 0.2 V. Field-effect mobility $\mu_{fe}$ was measured for the TFT when the above-described heat treatment was performed at 250° C. in the nitrogen atmosphere and the TFT when the above-described heat treatment was performed at 350° C. in the nitrogen atmosphere. The result is shown in Table 1 to Table 3.

Furthermore, the following test for evaluating the reliability under light irradiation was performed. 2000 lux of white light generated by an LED was applied from above the TFT. With source-gate voltage $V_{gs}$ applied to between source electrode 5 and gate electrode 2 being fixed to −35 V, application of this source-gate voltage $V_{gs}$ was continued for 1 hour, while applying the white light. By using the aforementioned method, threshold voltage $V_{th}$ was obtained 1 second, 15 seconds, 150 seconds, 450 seconds, and 2500 seconds after the start of application, and a difference $\Delta V_{th}$ between maximum threshold voltage $V_{th}$ and minimum threshold voltage $V_{th}$ was obtained. It is determined that as $\Delta V_{th}$ becomes smaller, the reliability under light irradiation becomes higher. $\Delta V_{th}$ was measured for the TFT when the above-described heat treatment was performed at 250° C. in the nitrogen atmosphere and the TFT when the above-described heat treatment was performed at 350° C. in the nitrogen atmosphere. The result is shown in Table 1 to Table 3.

TABLE 1

| | Oxide Semiconductor Layer | | | | | | |
|---|---|---|---|---|---|---|---|
| | W Content Rate (atomic %) | Zn Content Rate (atomic %) | Zn/W Ratio | Zr Content (atms/cm$^3$) | S/D Electric Resistivity (Ωcm) | Crystallinity | Film Thickness (nm) |
| Example 1 | 0.02 | 18.0 | 900 | 2 × 10$^{19}$ | 1 × 10$^{-3}$ | A | 50 |
| Example 2 | 0.08 | 5.0 | 63 | 8 × 10$^{18}$ | 1 × 10$^{-3}$ | A | 50 |
| Example 3 | 0.08 | 18.0 | 225 | 2 × 10$^{19}$ | 1 × 10$^{-3}$ | A | 50 |
| Example 4 | 0.08 | 25 | 313 | 3 × 10$^{19}$ | 1 × 10$^{-3}$ | N | 50 |
| Example 5 | 0.5 | 18 | 36 | 1 × 10$^{17}$ | 1 × 10$^{-3}$ | N | 30 |
| Example 6 | 0.8 | 18 | 23 | 2 × 10$^{18}$ | 2 × 10$^{-3}$ | N | 30 |
| Example 7 | 1.2 | 5.0 | 4 | — | 5 × 10$^{-3}$ | A | 50 |
| Example 8 | 1.2 | 18.0 | 15 | — | 3 × 10$^{-3}$ | N | 50 |
| Example 9 | 1.2 | 25.0 | 21 | — | 6 × 10$^{-3}$ | N | 50 |
| Example 10 | 1.2 | 35.0 | 29 | — | 7 × 10$^{-3}$ | A | 50 |
| Example 11 | 1.2 | 5.0 | 4 | 3 × 10$^{18}$ | 6 × 10$^{-3}$ | A | 30 |
| Example 12 | 1.2 | 18.0 | 15 | 4 × 10$^{19}$ | 5 × 10$^{-3}$ | N | 30 |
| Example 13 | 1.2 | 25.0 | 21 | 8 × 10$^{19}$ | 8 × 10$^{-3}$ | N | 30 |
| Example 14 | 1.2 | 35.0 | 29 | 8 × 10$^{18}$ | 9 × 10$^{-3}$ | A | 30 |
| Example 15 | 2.0 | 15.0 | 8 | 3 × 10$^{17}$ | 1 × 10$^{-2}$ | N | 30 |
| Example 16 | 3.2 | 18.0 | 6 | 7 × 10$^{19}$ | 2 × 10$^{-2}$ | N | 30 |
| Example 17 | 4.0 | 18.0 | 5 | 3 × 10$^{17}$ | 4 × 10$^{-2}$ | N | 30 |
| Example 18 | 5.0 | 20.0 | 4 | 4 × 10$^{18}$ | 9 × 10$^{-2}$ | N | 30 |

| | Heating Treatment During Film Formation | | | Evaluation of Characteristics | | | | | |
|---|---|---|---|---|---|---|---|---|---|
| | Heating Treatment | Treatment Temperature (° C.) | Third Insulating Layer 9 | Mobility (250° C.) (cm$^2$/Vs) | Mobility (350° C.) (cm$^2$/Vs) | $V_{th}$ (250° C.) (V) | $V_{th}$ (350° C.) (V) | $\Delta V_{th}$ (250° C.) (V) | $\Delta V_{th}$ (350° C.) (V) |
| Example 1 | not performed | — | after | 45 | 42 | −4.5 | −5.5 | 0.2 | 0.06 |
| Example 2 | not performed | — | after | 42 | 12 | −2.4 | −3.6 | 0.4 | 0.05 |
| Example 3 | not performed | — | after | 40 | 38 | −2.6 | −2.4 | 0.3 | 0.04 |
| Example 4 | not performed | — | after | 38 | 21 | −1.4 | −1.1 | 0.4 | 0.07 |
| Example 5 | not performed | — | after | 38 | 35 | −0.1 | 0.4 | 0.5 | 0.1 |
| Example 6 | not performed | — | after | 32 | 30 | −0.2 | 0.0 | 0.7 | 0.2 |
| Example 7 | not performed | — | before | 38 | 12 | 0.9 | 1.2 | 1.4 | 0.6 |
| Example 8 | not performed | — | before | 36 | 36 | 1.2 | 1.5 | 1.3 | 0.3 |
| Example 9 | not performed | — | before | 33 | 33 | 1.5 | 1.8 | 1.6 | 0.8 |
| Example 10 | not performed | — | before | 30 | 28 | 1.8 | 2.0 | 1.8 | 1.0 |
| Example 11 | not performed | — | none | 42 | 11 | 0.5 | 0.9 | 0.8 | 0.3 |
| Example 12 | not performed | — | none | 38 | 38 | 0.6 | 0.9 | 0.7 | 0.1 |
| Example 13 | not performed | — | none | 36 | 34 | 0.9 | 1.1 | 0.9 | 0.3 |
| Example 14 | not performed | — | none | 34 | 30 | 1.0 | 1.2 | 1.1 | 0.5 |
| Example 15 | performed | 150 | before | 26 | 24 | 1.6 | 1.9 | 1.0 | 0.8 |
| Example 16 | not performed | — | before | 18 | 18 | 2.2 | 2.4 | 1.3 | 0.9 |
| Example 17 | not performed | — | before | 16 | 17 | 2.7 | 2.9 | 1.6 | 1.2 |
| Example 18 | not performed | — | before | 12 | 11 | 4.0 | 4.2 | 1.8 | 1.4 |

TABLE 2

| | Oxide Semiconductor Layer | | | | | | |
|---|---|---|---|---|---|---|---|
| | W Content Rate (atomic %) | Zn Content Rate (atomic %) | Zn/W Ratio | Zr Content (atms/cm$^3$) | S/D Electric Resistivity (Ωcm) | Crystallinity | Film Thickness (nm) |
| Example 19 | 0.02 | 18.0 | 900 | 3 × 10$^{18}$ | 1 × 10$^{-3}$ | N | 30 |
| Example 20 | 0.08 | 5.0 | 63 | 3 × 10$^{18}$ | 1 × 10$^{-3}$ | A | 30 |
| Example 21 | 0.08 | 18.0 | 225 | 4 × 10$^{19}$ | 1 × 10$^{-3}$ | N | 30 |

TABLE 2-continued

| | | | | | | | | |
|---|---|---|---|---|---|---|---|---|
| Example 22 | 0.08 | 25 | 313 | $8 \times 10^{19}$ | $1 \times 10^{-3}$ | N | 30 | |
| Example 23 | 0.5 | 18 | 36 | $3 \times 10^{17}$ | $2 \times 10^{-3}$ | N | 10 | |
| Example 24 | 0.8 | 18 | 23 | $5 \times 10^{18}$ | $3 \times 10^{-3}$ | N | 50 | |
| Example 25 | 1.2 | 5.0 | 4 | — | $5 \times 10^{-3}$ | A | 30 | |
| Example 26 | 1.2 | 18.0 | 15 | — | $3 \times 10^{-3}$ | N | 30 | |
| Example 27 | 1.2 | 25.0 | 21 | — | $6 \times 10^{-3}$ | N | 30 | |
| Example 28 | 1.2 | 35.0 | 29 | — | $7 \times 10^{-3}$ | N | 30 | |
| Example 29 | 1.2 | 5.0 | 4 | $8 \times 10^{18}$ | $7 \times 10^{-3}$ | A | 50 | |
| Example 30 | 1.2 | 18.0 | 15 | $2 \times 10^{19}$ | $2 \times 10^{-3}$ | N | 50 | |
| Example 31 | 1.2 | 25.0 | 21 | $3 \times 10^{19}$ | $3 \times 10^{-3}$ | N | 50 | |
| Example 32 | 1.2 | 35.0 | 29 | $2 \times 10^{18}$ | $4 \times 10^{-3}$ | N | 50 | |
| Example 33 | 2.0 | 15.0 | 8 | $3 \times 10^{17}$ | $9 \times 10^{-3}$ | N | 50 | |
| Example 34 | 3.2 | 18.0 | 6 | $7 \times 10^{19}$ | $1 \times 10^{-2}$ | N | 50 | |
| Example 35 | 4.0 | 18.0 | 5 | $4 \times 10^{17}$ | $4 \times 10^{-2}$ | N | 50 | |
| Example 36 | 5.0 | 20.0 | 4 | $2 \times 10^{18}$ | $9 \times 10^{-2}$ | N | 50 | |

| | Heating Treatment During Film Formation | | | Evaluation of Characteristics | | | | | |
|---|---|---|---|---|---|---|---|---|---|
| | Heating Treatment | Treatment Temperature (°C.) | Third Insulating Layer 9 | Mobility (250° C.) (cm²/Vs) | Mobility (350° C.) | $V_{th}$ (250° C.) (V) | $V_{th}$ (350° C.) (V) | $\Delta V_{th}$ (250° C.) (V) | $\Delta V_{th}$ (350° C.) (V) |
| Example 19 | not performed | — | after | 46 | 46 | −5 | −6 | 0.1 | 0.04 |
| Example 20 | not performed | — | after | 43 | 13 | −3 | −4 | 0.3 | 0.03 |
| Example 21 | not performed | — | after | 41 | 39 | −3 | −3 | 0.2 | 0.02 |
| Example 22 | not performed | — | after | 38 | 23 | −2 | −2.5 | 0.3 | 0.03 |
| Example 23 | not performed | — | after | 40 | 38 | −0.8 | −0.3 | 0.2 | 0.06 |
| Example 24 | not performed | — | after | 28 | 27 | −0.2 | −0.1 | 0.9 | 0.4 |
| Example 25 | not performed | — | none | 39 | 14 | 0.6 | 1.0 | 1.2 | 0.4 |
| Example 26 | not performed | — | none | 37 | 37 | 0.9 | 0.9 | 1.0 | 0.2 |
| Example 27 | not performed | — | none | 35 | 34 | 1.1 | 1.0 | 1.2 | 0.6 |
| Example 28 | not performed | — | none | 32 | 30 | 1.4 | 1.2 | 1.6 | 0.7 |
| Example 29 | not performed | — | after | 40 | 9 | 0.7 | 0.9 | 0.9 | 0.5 |
| Example 30 | not performed | — | after | 36 | 34 | 0.8 | 1.2 | 0.8 | 0.3 |
| Example 31 | not performed | — | after | 34 | 32 | 1.1 | 1.4 | 1.1. | 0.5 |
| Example 32 | not performed | — | after | 33 | 29 | 1.2 | 1.6 | 1.3 | 0.7 |
| Example 33 | performed | 150 | before | 24 | 20 | 2.1 | 2.4 | 1.2 | 0.9 |
| Example 34 | not performed | — | before | 17 | 16 | 2.7 | 3.2 | 1.5 | 1.1 |
| Example 35 | not performed | — | before | 13 | 12 | 3.0 | 3.4 | 1.8 | 1.3 |
| Example 36 | not performed | — | before | 10 | 9 | 4.0 | 4.2 | 2.0 | 1.5 |

TABLE 3

| | Oxide Semiconductor Layer | | | | | | |
|---|---|---|---|---|---|---|---|
| | W Content Rate (atomic %) | Zn Content Rate (atomic %) | Zn/W Ratio | Zr Content (atms/cm³) | S/D Electric Resistivity (Ωcm) | Crystallinity | Film Thickness (nm) |
| Comparative Example 2 | 0 | 25.0 | — | $7 \times 10^{19}$ | $1 \times 10^{-3}$ | — | 50 |
| Comparative Example 3 | 6.0 | 0 | 0 | $3 \times 10^{17}$ | $1 \times 10^{-1}$ | — | 50 |
| Comparative Example 4 | 0 | 0 | — | $4 \times 10^{18}$ | $9 \times 10^{-3}$ | — | 50 |
| Comparative Example 5 | 0.001 | 18.0 | 18000 | $2 \times 10^{19}$ | $2 \times 10^{-3}$ | N | 50 |
| Comparative Example 6 | 0.001 | 25.0 | 25000 | $2 \times 10^{19}$ | $2 \times 10^{-3}$ | N | 50 |
| Comparative Example 7 | 9.0 | 18.0 | 2 | $2 \times 10^{19}$ | $2 \times 10^{-3}$ | N | 50 |
| Comparative Example 8 | 1.2 | 45 | 38 | $2 \times 10^{19}$ | $2 \times 10^{-3}$ | N | 50 |
| Comparative Example 9 | 1.2 | 1.0 | 1 | $2 \times 10^{19}$ | $2 \times 10^{-3}$ | A | 50 |

| | Heating Treatment During Film Formation | | | Evaluation of Characteristics | | | | | |
|---|---|---|---|---|---|---|---|---|---|
| | Heating Treatment | Treatment Temperature (°C.) | Third Insulating Layer 9 | Mobility (250° C.) (cm²/Vs) | Mobility (350° C.) | $V_{th}$ (250° C.) (V) | $V_{th}$ (350° C.) (V) | $\Delta V_{th}$ (250° C.) (V) | $\Delta V_{th}$ (350° C.) (V) |
| Comparative Example 2 | not performed | — | none | 24 | 24 | −30 | −33 | 11 | 9 |

TABLE 3-continued

| | | | | | | | | | |
|---|---|---|---|---|---|---|---|---|---|
| Comparative Example 3 | not performed | — | before | 12 | 1 | 6 | 7 | 4 | 3 |
| Comparative Example 4 | not performed | — | after | 30 | 0.1 | −32 | −34 | 12 | 10 |
| Comparative Example 5 | not performed | — | after | 42 | 6 | −5 | −6 | 6 | 4 |
| Comparative Example 6 | not performed | — | after | 42 | 5 | −6 | −8 | 7 | 6 |
| Comparative Example 7 | not performed | — | after | 2 | 2 | 5 | 6 | 3 | 3 |
| Comparative Example 8 | not performed | — | after | 36 | 5 | −0.5 | −1.0 | 7 | 4 |
| Comparative Example 9 | not performed | — | after | 38 | 1 | −1 | 0.1 | 1.1 | 2 |

It should be understood that the embodiments disclosed herein are illustrative and non-restrictive in every respect. The scope of the present invention is defined by the terms of the claims, rather than the embodiments described above, and is intended to include any modifications within the meaning and scope equivalent to the terms of the claims.

REFERENCE SIGNS LIST

1 substrate; 2 gate electrode; 3 first insulating layer (gate insulating layer); 4 oxide semiconductor layer; 5 source electrode; 6 drain electrode; 7 channel layer; 8 insulating protective layer (second insulating layer); 9 insulating protective layer (third insulating layer); 10 resist layer; 11 low oxygen insulating layer; 12 width of gate electrode; 13 distance of gate electrode; 14 width of channel layer; 15 length of channel layer.

The invention claimed is:

1. A semiconductor device comprising:
   a gate electrode;
   a channel layer arranged in a region directly below or directly above the gate electrode;
   a source electrode and a drain electrode arranged to be in contact with the channel layer; and
   a first insulating layer arranged between the gate electrode and the channel layer,
   the channel layer including a first oxide semiconductor, and at least one of the source electrode and the drain electrode including a second oxide semiconductor,
   the first oxide semiconductor and the second oxide semiconductor containing indium, tungsten and zinc,
   a content rate of tungsten to a total of indium, tungsten and zinc in the first oxide semiconductor and the second oxide semiconductor being higher than 0.001 atomic % and not higher than 8.0 atomic %,
   a content rate of zinc to the total of indium, tungsten and zinc in the first oxide semiconductor and the second oxide semiconductor being not lower than 1.2 atomic % and not higher than 40 atomic %,
   an atomic ratio of zinc to tungsten in the first oxide semiconductor and the second oxide semiconductor being higher than 1.0 and lower than 20000, wherein
   the first oxide semiconductor contains hexavalent tungsten.

2. The semiconductor device according to claim 1, wherein
   content rates of indium, tungsten and zinc in the first oxide semiconductor are the same as content rates of indium, tungsten and zinc in the second oxide semiconductor, respectively.

3. The semiconductor device according to claim 1, wherein
   an electric resistivity of the channel layer is not lower than $10^{-1}$ Ωcm, and
   an electric resistivity of the source electrode and the drain electrode is not higher than $10^{-2}$ Ωcm.

4. The semiconductor device according to claim 1, wherein
   the first oxide semiconductor and the second oxide semiconductor are composed of nanocrystalline oxide or amorphous oxide.

5. The semiconductor device according to claim 1, wherein
   the channel layer further contains zirconium, and
   a content of the zirconium is not smaller than $1 \times 10^{17}$ atms/cm$^3$ and not larger than $1 \times 10^{20}$ atms/cm$^3$.

6. A method for manufacturing the semiconductor device as recited in claim 1, comprising:
   forming the gate electrode;
   forming a layer including an oxide semiconductor;
   forming a partially covering insulating layer covering a part of a main surface of the layer including the oxide semiconductor; and
   performing heat treatment after forming the partially covering insulating layer.

7. The manufacturing method according to claim 6, further comprising
   forming a low oxygen insulating layer covering a region adjacent to the part of the main surface of the layer including the oxide semiconductor, after forming the layer including the oxide semiconductor and before performing the heat treatment, wherein
   the low oxygen insulating layer is lower in oxygen atom content rate than the partially covering insulating layer.

8. The manufacturing method according to claim 6, wherein
   the partially covering insulating layer is the first insulating layer or a second insulating layer different from the first insulating layer.

9. The manufacturing method according to claim 6, wherein
   in forming the partially covering insulating layer, the partially covering insulating layer is patterned by self alignment with the gate electrode.

10. The manufacturing method according to claim 6, wherein
    performing the heat treatment includes performing heat treatment at a temperature of not lower than 100° C. and not higher than 500° C.

11. A semiconductor device comprising:
a gate electrode;
a channel layer arranged in a region directly below or directly above the gate electrode;
a source electrode and a drain electrode arranged to be in contact with the channel layer; and
a first insulating layer arranged between the gate electrode and the channel layer,
the channel layer including a first oxide semiconductor, and at least one of the source electrode and the drain electrode including a second oxide semiconductor,
the first oxide semiconductor and the second oxide semiconductor containing indium, tungsten and zinc,
a content rate of tungsten to a total of indium, tungsten and zinc in the first oxide semiconductor and the second oxide semiconductor being higher than 0.001 atomic % and not higher than 8.0 atomic %,
a content rate of zinc to the total of indium, tungsten and zinc in the first oxide semiconductor and the second oxide semiconductor being not lower than 1.2 atomic % and not higher than 40 atomic %,
an atomic ratio of zinc to tungsten in the first oxide semiconductor and the second oxide semiconductor being higher than 1.0 and lower than 20000, wherein
the first insulating layer is a layer covering a main surface of the channel layer and not covering main surfaces of the source electrode and the drain electrode, and
the semiconductor device further comprises a low oxygen insulating layer that is an insulating layer covering the main surfaces of the source electrode and the drain electrode and is lower in oxygen atom content rate than the first insulating layer.

12. The semiconductor device according to claim 11, wherein
content rates of indium, tungsten and zinc in the first oxide semiconductor are the same as content rates of indium, tungsten and zinc in the second oxide semiconductor, respectively.

13. The semiconductor device according to claim 11, wherein
an electric resistivity of the channel layer is not lower than $10^{-1}$ Ωcm, and
an electric resistivity of the source electrode and the drain electrode is not higher than $10^{-2}$ Ωcm.

14. The semiconductor device according to claim 11, wherein
the first oxide semiconductor and the second oxide semiconductor are composed of nanocrystalline oxide or amorphous oxide.

15. The semiconductor device according to claim 11, wherein
the channel layer further contains zirconium, and
a content of the zirconium is not smaller than $1\times10^{17}$ atms/cm$^3$ and not larger than $1\times10^{20}$ atms/cm$^3$.

16. A semiconductor device comprising:
a gate electrode;
a channel layer arranged in a region directly below or directly above the gate electrode;
a source electrode and a drain electrode arranged to be in contact with the channel layer; and
a first insulating layer arranged between the gate electrode and the channel layer,
the channel layer including a first oxide semiconductor, and at least one of the source electrode and the drain electrode including a second oxide semiconductor,
the first oxide semiconductor and the second oxide semiconductor containing indium, tungsten and zinc,
a content rate of tungsten to a total of indium, tungsten and zinc in the first oxide semiconductor and the second oxide semiconductor being higher than 0.001 atomic % and not higher than 8.0 atomic %,
a content rate of zinc to the total of indium, tungsten and zinc in the first oxide semiconductor and the second oxide semiconductor being not lower than 1.2 atomic % and not higher than 40 atomic %,
an atomic ratio of zinc to tungsten in the first oxide semiconductor and the second oxide semiconductor being higher than 1.0 and lower than 20000, wherein
the semiconductor device further comprises:
a second insulating layer covering a main surface of the channel layer and not covering main surfaces of the source electrode and the drain electrode; and
a low oxygen insulating layer that is an insulating layer covering the main surfaces of the source electrode and the drain electrode and is lower in oxygen atom content rate than the second insulating layer.

17. The semiconductor device according to claim 16, wherein
content rates of indium, tungsten and zinc in the first oxide semiconductor are the same as content rates of indium, tungsten and zinc in the second oxide semiconductor, respectively.

18. The semiconductor device according to claim 16, wherein
an electric resistivity of the channel layer is not lower than $10^{-1}$ Ωcm, and
an electric resistivity of the source electrode and the drain electrode is not higher than $10^{-2}$ Ωcm.

19. The semiconductor device according to claim 16, wherein
the first oxide semiconductor and the second oxide semiconductor are composed of nanocrystalline oxide or amorphous oxide.

20. The semiconductor device according to claim 16, wherein
the channel layer further contains zirconium, and
a content of the zirconium is not smaller than $1\times10^{17}$ atms/cm$^3$ and not larger than $1\times10^{20}$ atms/cm$^3$.

* * * * *